(12) United States Patent
Koyama et al.

(10) Patent No.: US 8,115,109 B2
(45) Date of Patent: Feb. 14, 2012

(54) CIRCUIT BOARD AND METHOD FOR JOINTING CIRCUIT BOARD

(75) Inventors: Masayoshi Koyama, Osaka (JP);
Norihito Tsukahara, Kyoto (JP);
Susumu Matsuoka, Osaka (JP)

(73) Assignee: Panasonic Corporation, Osaka (JP)

(*) Notice: Subject to any disclaimer, the term of this patent is extended or adjusted under 35 U.S.C. 154(b) by 302 days.

(21) Appl. No.: 12/427,991

(22) Filed: Apr. 22, 2009

(65) Prior Publication Data

US 2009/0266592 A1    Oct. 29, 2009

(30) Foreign Application Priority Data

Apr. 24, 2008   (JP) .................. 2008-113553

(51) Int. Cl.
*H05K 1/11* (2006.01)
(52) U.S. Cl. .............. 174/261; 174/259; 29/830
(58) Field of Classification Search ............. 174/261
See application file for complete search history.

(56) References Cited

U.S. PATENT DOCUMENTS

| | | | | |
|---|---|---|---|---|
| 3,703,254 A | * | 11/1972 | Maierson et al. | 428/407 |
| 4,589,584 A | * | 5/1986 | Christiansen et al. | 228/111.5 |
| 4,950,527 A | * | 8/1990 | Yamada | 428/192 |
| 5,062,896 A | * | 11/1991 | Huang et al. | 106/287.19 |
| 5,461,202 A | * | 10/1995 | Sera et al. | 174/254 |
| 5,511,719 A | * | 4/1996 | Miyake et al. | 228/106 |
| 5,717,476 A | * | 2/1998 | Kanezawa | 349/149 |
| 6,527,162 B2 | * | 3/2003 | Totani et al. | 228/175 |
| 6,784,375 B2 | * | 8/2004 | Miyake et al. | 174/261 |
| 6,867,668 B1 | * | 3/2005 | Dagostino et al. | 333/246 |
| 6,930,240 B1 | * | 8/2005 | Giboney et al. | 174/393 |
| 7,214,887 B2 | * | 5/2007 | Higashida et al. | 174/260 |
| 7,286,370 B2 | * | 10/2007 | Ooyabu | 361/803 |
| 7,759,162 B2 | * | 7/2010 | Karashima et al. | 438/108 |
| 2001/0008310 A1 | * | 7/2001 | Sakuyama et al. | 257/737 |
| 2008/0283284 A1 | * | 11/2008 | Koyama et al. | 174/261 |
| 2009/0133901 A1 | * | 5/2009 | Karashima et al. | 174/250 |

FOREIGN PATENT DOCUMENTS

WO    WO 2007122868 A1 * 11/2007

* cited by examiner

*Primary Examiner* — Xiaoliang Chen
*Assistant Examiner* — Nathan Milakovich
(74) *Attorney, Agent, or Firm* — Steptoe & Johnson LLP

(57) ABSTRACT

A circuit board in which end faces (36a) of wires are located in positions withdrawn from the end in a joint region of a first board (31a), end faces (36b) of wires are located in positions withdrawn from the end in a joint region of a second board (31b), a gap (W) between the end faces (36a) of the wires of the first board (31a) and the end faces (36b) of the wires of the second board (31b) is filled with a conductor (16A), and the first board (31a) and the second board (31b) are jointed by means of a resin.

6 Claims, 20 Drawing Sheets

FIG. 4

| CONDUCTIVE PARTICLES | MELTING POINT (SOLID PHASE LINE) (°C) |
|---|---|
| Sn-58Bi | 139 |
| Sn-37Pb | 183 |
| Sn-9Zn | 199 |
| Sn-3.0Ag-0.5Cu | 217 |
| Sn-3.5Ag | 221 |
| Sn-0.7Cu | 228 |
| 12Sn-2.0Ag-10Sb-Pb | 240 |

FIG. 5

| BUBBLE GENERATING AGENT | BOILING POINT (°C) | BUBBLE GENERATING AGENT | BOILING POINT (°C) |
|---|---|---|---|
| HEXANE | 69 | DIMETHYL AMINE HYDROCHLORIDE | 171 |
| VINYL ACETATE | 72 | DIMETHYL SULFOXIDE (DMSO) | 189 |
| ISOPROPYL ALCOHOL | 83 | ETHYLENE GLYCOL | 198 |
| WATER | 100 | N-METHYL-2-PYRROLIDONE (NMP) | 204 |
| 1,4-DIOXANE | 101 | α-TERPINEOL | 218 |
| BUTYL ACETATE | 126 | BUTYL CARBITOL | 231 |
| PROPIONIC ACID | 141 | BUTYL CARBITOL ACETATE | 246 |

FIG. 6

| BUBBLE GENERATING AGENT | PYROLYSIS TEMPERATURE |
|---|---|
| BORIC ACID | 70~ |
| AMMONIUM METABORATE | 120~ |
| SODIUM HYDROGEN CARBONATE | 120-150 |
| 4,4'-OXY BIS(BENZENE SULFONYL HYDRAZIDE (OBSH) | 155-165 |
| AZO DICARBON AMIDE (ADCA) | 197-210 |
| BARIUM METABORATE | 200~ |
| N,N'- DINITROSO PENTAMETHYLENE TETRAMINE (DPT) | 200-250 |
| ALUMINUM HYDROXIDE | 230 |
| CALCIUM ALUMINATE | 230 |
| DAWSONITE | 230 |

CIRCUIT BOARD AND METHOD FOR JOINTING CIRCUIT BOARD

BACKGROUND OF THE INVENTION

1. Field of Invention

The present invention relates to a circuit board in which respective boards having wires are connected together electrically, and to a method for jointing a circuit board.

2. Description of the Related Art

In flip chip mounting for installing an electronic component on a circuit board, bumps are formed on the wire terminals of the board and the electrodes of the electronic component. As a technique for forming bumps of wire terminals, in recent years, a method for forming bumps by self-assembly of conductive particles (for example, solder powder) on the wire terminals of a board and the electrodes of an electronic component has come to be used instead of the conventional methods of "solder pasting" and "super soldering". Alternatively, a method has also been proposed for flip chip mounting of an electronic component on a circuit board by forming a conductor between the wire terminals of the board and the electrodes of the electronic component by self-assembly of conductive particles between the board and the electrodes of the electronic component (see, for example, Japanese Patent Publication No. 3964911 and Japanese Patent Publication No. 3955302).

FIGS. 9A to 9D and FIGS. 10A to 10D show prior art technology for forming bumps by self-assembly of conductive particles.

Firstly, as shown in FIG. 9A, a resin 114 containing solder powder 116 and a bubble generating agent (not illustrated) is supplied onto a board 31 having a plurality of pad electrodes 32.

Thereupon, as shown in FIG. 9B, a flat sheet 140 is laid on the surface of the resin 114.

When the resin 114 is heated in this state, as shown in FIG. 9C, gas bubbles 30 are produced from the bubble generating agent contained in the resin 114. Furthermore, as shown in FIG. 9D, a portion of the resin 114 is pushed out by the generated gas bubbles 30 as they grow.

As shown in FIG. 10A, the resin 114 pushed out in this way self-assembles into column shapes at the interfaces with the pad electrodes 32 of the board 31 and the interfaces with the flat sheet 140. Furthermore, a part of the resin 114 which is present in the edge portions of the board 31 is pushed out beyond the outer edges of the board 31 (not illustrated).

Thereupon, if the resin 114 is heated further, then the solder powder 116 contained in the resin 114 melts as shown in FIG. 10B, and the respective particles of solder powder 116 contained in the resin 114 which has self-assembled over the pad electrodes 32 melt and join together.

The pad electrodes 32 have higher wettability with respect to the solder powder 116 that has melted and joined together, and therefore bumps 19 made of molten solder powder are formed on the pad electrodes 32, as shown in FIG. 10C.

Finally, the resin 114 and the flat sheet 140 are removed as shown in FIG. 10D, thereby yielding a board 31 on which bumps 19 have been formed on the pad electrodes 32.

In the steps described above, the amount of resin 114 supplied is depicted in exaggerated fashion, and in actual practice, an amount of resin 114 which is suitable for self-assembly on the pad electrodes 32 and which allows for errors is supplied.

The characteristic feature of this prior art method lies in that by heating the resin 114 supplied between the board 31 and the flat sheet 140, gas bubbles 30 are produced by the bubble generating agent, the resin 114 is pushed to the exterior of the gas bubbles as the gas bubbles 30 grow, and thereby the resin 114 which still contains the solder powder 116 self-assembles between the pad electrodes 32 of the board 31 and the flat sheet 140.

The phenomenon of the resin 114 self-assembling on top of the pad electrodes 32 is thought to occur as a result of the mechanism shown in FIG. 11A and FIG. 11B.

FIG. 11A shows a state where the resin 114 has been pushed out onto the pad electrodes 32 of the board 31 by the gas bubbles as they grow (not illustrated). In the resin 114 which makes contact with the pad electrode 32, the force Fs which corresponds to the surface tension at the interface (the force generated by the wetting and spreading of the resin) is greater than the stress $F\eta$ produced as a result of the viscosity $\eta$ of the resin, and therefore the resin 114 spreads over the whole surface of the pad electrode 32 and ultimately, a column-shaped resin having borders at the edges of the pad electrode 32 is formed between the pad electrode 32 and the flat sheet 140.

Although the stress Fb created by the growth (or movement) of the gas bubbles 30 acts on the column-shaped resin 114 formed by self-assembly on the pad electrodes 32 as shown in FIG. 11B, due to the action of the stress $F\eta$ created by the viscosity $\eta$ of the resin 114, the shape of the resin can be maintained and hence the resin 114 which has self-assembled onto the pad electrodes 32 is never eliminated.

Here, the capability to maintain the prescribed shape of the resin 114 which has self-assembled is dependent on the surface area S of the pad electrodes 32, the interval L between the pad electrodes 32 and the flat sheet 140, and the viscosity $\eta$ of the resin 114, in addition to the stress Fs corresponding to the surface tension. If the reference value for maintaining the resin 114 with a prescribed shape is taken as "T", then a relationship of the following kind can be established in respect of the stability.

$$T = K \cdot (S/L) \cdot \eta \cdot Fs \ (K: \text{constant})$$

In this way, the prior art method forms a resin 114 on the pad electrodes 32 in a self-aligning fashion by utilizing a self-assembly phenomenon resulting from the surface tension of the resin 114, and it can be seen as utilizing the fact that the self-assembly due to the surface tension occurs in between the flat sheet 140 and the pad electrodes 32 where the gap between the board 31 and the flat sheet 140 is most narrow because the pad electrodes 32 are formed in a projecting shape on the surface of the board 31.

If this prior art method is used, it is possible to make the solder powder dispersed inside the resin 114 self-assemble efficiently on top of the pad electrodes, and therefore bumps can be formed with excellent uniformity and a high rate of productivity.

Furthermore, since the solder powder which is dispersed in the resin can be made to self-assemble indivisibly onto the plurality of electrodes on the board onto which the resin has been supplied, then this method is particularly useful when forming bumps uniformly and simultaneously onto all of the electrodes of a circuit board.

The technology for self-assembling solder powder by causing self-assembly of resin as described above can be used for other applications, apart from forming bumps.

The present inventors have discovered, as one application of this kind, the use of such technology in jointing circuit boards.

Flexible printed circuits (hereinafter, abbreviated as "FPC") which are thin and bendable are frequently used in the internal wiring of electronic equipment such as mobile telephone devices or digital cameras. In recent years, the use of FPCs has grown with the increasing compactification of portable devices and the rising number of moving parts. When jointing an FPC to a hard board which is used as a main circuit board, generally connectors are used, and these have a significant advantage in that they enable the FPC to be attached and detached repeatedly.

Even if attachment and detachment are not necessary, there is an advantage in that boards can be jointed easily. However, when jointing with connectors, the three-dimensional space occupied by the connectors is an obstacle to making equipment more compact and reducing its thickness. Furthermore, the minimum pitch of present-day connectors is generally 0.3 mm, and it is difficult to joint electrode terminals having a narrower pitch than this.

On the other hand, there are also rigid flex boards in which a hard board and an FPC are integrated completely. A rigid flex board has an advantage in that it does not require connections on the outer perimeter since an FPC is sandwiched in an inner layer of a hard board, but the manufacturing process is long and complicated steps are involved in assembling hard boards having different numbers of layers.

In these circumstances, recently, it has been possible to manufacture circuit boards having a similar structure to rigid flex boards, by jointing together different hard circuit boards by means of an FPC. In this way, it is possible to simplify the steps compared to those involved in a rigid flex board, and the outer shape and structure of the circuit board are less likely to be restricted.

Therefore, it could be considered effective to use prior art technology which self-assembles solder powder in order to joint boards which have electrode terminals arranged at narrow pitch of this kind.

On the other hand, the present inventors discovered phenomena of the following kind when the method described above is adapted to joint one circuit board to another circuit board. These phenomena are described below.

FIG. 12 shows a wiring board used to investigate jointing.

A band-shaped plurality of wires 33a are provided on a board 31a, and a connecting terminal (hereinafter, called connecting terminal 34a) is formed in the end region 34a of the board 31a.

The wiring rules are as follows: the width of the wires 33a is 0.05 mm, a space 35a between mutually adjacent wires is 0.05 mm and the pitch is 0.1 mm.

An appropriate amount of resin 114 containing solder powder and a bubble generating agent (not illustrated) is applied to the central portion of the connecting terminal 34a of the board 31a.

Next, as shown in FIG. 13A and FIG. 13B, the end portion of a separate board 31b to the board 31a is placed in overlapping fashion over the board 31a to which the resin 114 has been applied in FIG. 12, and the connecting terminal in an end region 34b of the board 31b (hereinafter, called "connecting terminal 34b") is placed so as to oppose the connecting terminal 34a of the board 31a via the resin 114. Here, the connecting terminals 34a and 34b respectively have the same dimensions and the same pitch.

When the resin 114 is heated in this state, it is expected that the solder powder in the resin 114 self-assembles in the region where the connecting terminal 34a and the connecting terminal 34b overlap, and then melts and solidifies, thereby jointing the board 31a and the board 31b.

However, when the heating step was actually carried out, a large amount of resin 114 and solder powder moved outside the region of overlap between the connecting terminal 34a and the connecting terminal 34b, as shown in FIG. 14. There was particularly marked movement of the resin 114 and the solder powder from the spaces 35a between the mutually adjacent wires on the board 31a and spaces 35b between mutually adjacent wires on the board 31b.

When the overlapping portion between the board 31a and the board 31b was observed with an X-ray fluoroscope, the solder powder which had moved and assembled as shown in FIG. 15 had melted and solidified. Numeral 16a is a portion where the solvent powder has assembled and solidified outside the connection region, numeral 16b is a portion where there is insufficient solder in the connecting terminal, and numeral 16c is an unconnected portion. Not all of the solder powder had assembled into the overlapping region of the connecting terminal 34a and the connecting terminal 34b.

In this way, it was seen that it is necessary to eliminate the problems described above, in order to joint boards having a connecting terminal arranged in a fine band shape by using self-assembly of conductive particles, such as solder powder, onto the electrodes.

SUMMARY OF THE INVENTION

An object of the present invention is to provide a circuit board and a method for jointing a circuit board whereby respective circuit boards on which a fine band-shaped connecting terminal is provided can be jointed satisfactorily by self-assembly of conductive particles.

The circuit board according to the present invention is a circuit board in which a joint region in an end portion of a first board and a joint region in an end portion of a second board are mutually superimposed and jointed, with wires formed on the respective surfaces of the boards facing to the inner side, wherein end faces of the wires are located at positions withdrawn from an end in the joint region of the first board, end faces of the wires are located at positions withdrawn from an end in the joint region of the second board, a gap between the end faces of the wires of the first board and the end faces of the wires of the second board is filled with a conductor, and the first board and the second board are jointed by means of a resin.

More specifically, the planar shape of the end portions of the wires of the first and second boards is either an oblique shape, a key shape, a concavoconvex shape, a step shape or a funnel shape.

More specifically, the distance between the end faces of the wires of the first board and the end faces of the wires of the second board is smaller than the interval between the wires on the first board and the interval between the wires on the second board.

More specifically, end faces of connecting terminals are abutted against each other in such a manner that the centers of the connecting terminals coincide with each other.

More specifically, the end faces of the wires of the first board and the end faces of the wires of the second board are abutted against each other in such a manner that a uniform gap is maintained between the end faces.

More specifically, the wires are formed in parallel respectively on the first board and the second board, and mutually adjacent first and second wires of the wires are withdrawn from the end by different distances.

Furthermore, the method for jointing a circuit board according to the present invention is a method for jointing a circuit board in which a joint region in an end portion of a first board and a joint region in an end portion of a second board are mutually superimposed and jointed, with wires formed on the respective surfaces of the boards facing to the inner side, comprising the steps of: mutually superimposing the first board in which end faces of the wires are located at positions withdrawn from an end and the second board in which end faces of the wires are located at positions withdrawn from an end, in such a manner that the end faces of the wires of the first board and the end faces of the wires of the second board oppose each other, and aligning the first and second boards in mutually abutting positions; applying a conductive jointing material containing a bubble generating agent and conductive particles to at least one of the joint region of the first board and the joint region of the second board or to a gap between the end faces of the wires, before superimposing the joint regions; and heating and then cooling the conductive jointing material and filling the gap between the end faces of the wires of the first board and the end faces of the wires of the second board by means of the conductive particles that have assembled, melted and solidified.

The uniform gap is larger than the particle size of the conductive particles and smaller than the space between the wires.

The conductive jointing material is a fluid containing conductive particles and a bubble generating agent, and the conductive jointing material contains a material that generates gas by boiling or pyrolysis upon heating.

By adopting this composition, circuit boards on which a fine band-shaped connecting terminal is arranged can be jointed satisfactorily by self-assembly of conductive particles.

BRIEF DESCRIPTION OF THE DRAWINGS

FIG. 4 is a diagram showing one example of materials of conductive particles relating to respective embodiments of the present invention;

FIG. 5 is a diagram showing one example of materials of a bubble generating agent relating to the respective embodiments of the present invention;

FIG. 6 is a diagram showing one example of materials of a bubble generating agent relating to the respective embodiments of the present invention;

DESCRIPTION OF THE PREFERRED EMBODIMENTS

Below, embodiments of the present invention are described with reference to the drawings.

First Embodiment

A first embodiment of the present invention is now described with reference to FIG. 1A and FIG. 1B.

Figure 1A:
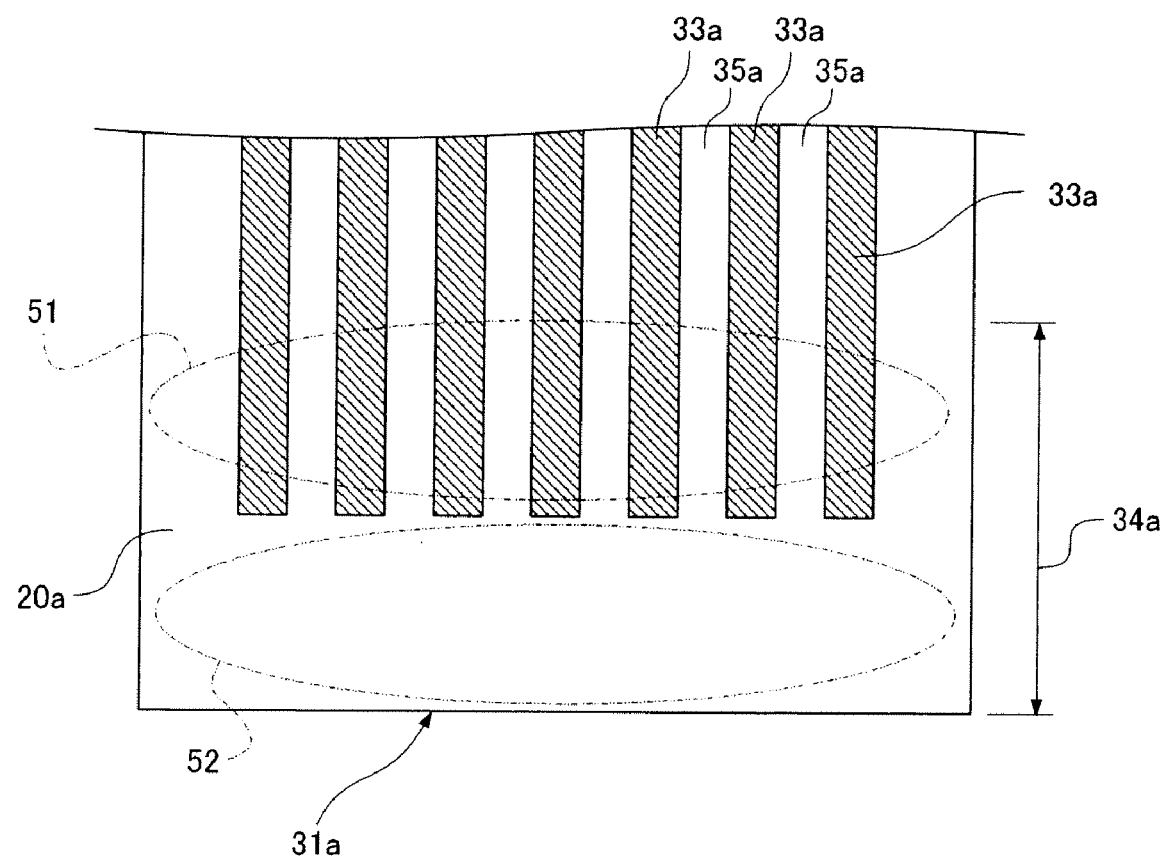
FIG. 1A is an enlarged plan diagram of a circuit board used in a method for jointing a circuit board according to a first embodiment of the present invention.
Figure 1B:
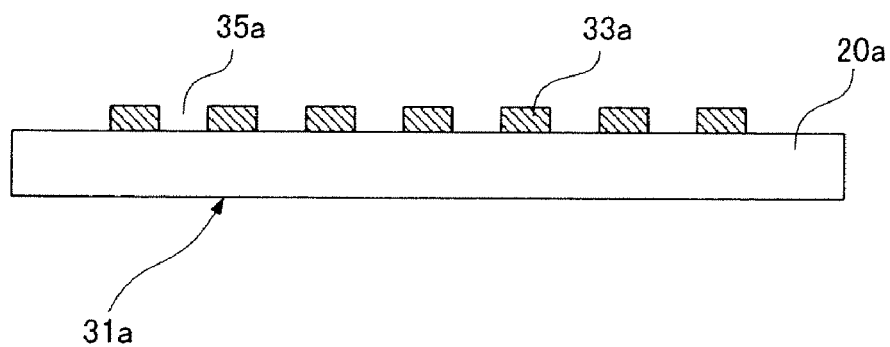
FIG. 1B is a front view diagram of FIG. 1A.

FIG. 1A and FIG. 1B show a plan diagram and a front view diagram of a circuit board, and wires 33a are hatched in the drawings in order to distinguish the wires 33a from the other portions.

A board 31a which is a first circuit board has a plurality of wires 33a arranged on an insulator 20a, and a connecting terminal (hereinafter, called "connecting terminal 34a") is formed in the end region 34a of the board. The connecting terminal 34a is constituted by a first region 51 where the wires 33a are formed with spaces 35a therebetween, and a second region 52 where the wires 33a are not formed.

The width of the wires 33a is 0.05 mm and the width of the spaces 35a between the mutually adjacent wires 33a is 0.05 mm. Consequently, the wires 33a are formed using a wiring rule of 0.1 mm pitch. The connecting terminal 34a has a total length of 1.0 mm from the end of the insulator 20a. A front end position 36a of the wires 33a is 0.5 mm from the end of the insulator 20a. Furthermore, the thickness of the wires 33a is approximately 15 μm (nickel/gold plating 3 μm thick on top of copper foil 12 μm.

In the end portion of a board 31b which is a second circuit board that is jointed in an overlapping fashion to the end portion of the board 31a, similarly to the connecting terminal 34a, there is a first region 51 where wires 33b separated by spaces 35b are formed and a second region 52 where wires 33a are not formed.

The board 31b has the same shape as the board 31a, and has a connecting terminal 34b of the same shape and dimensions as the connecting terminal 34a.

Figure 3A:
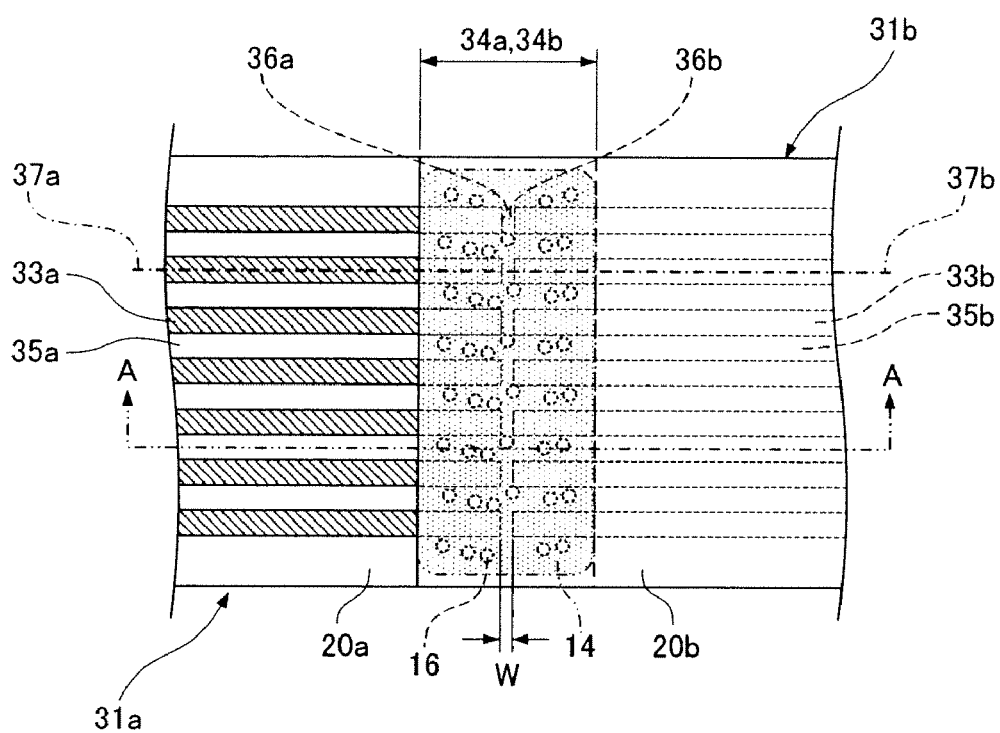
FIG. 3A is a plan diagram illustrating the method for jointing a circuit board according to the same embodiment.
Figure 3B:
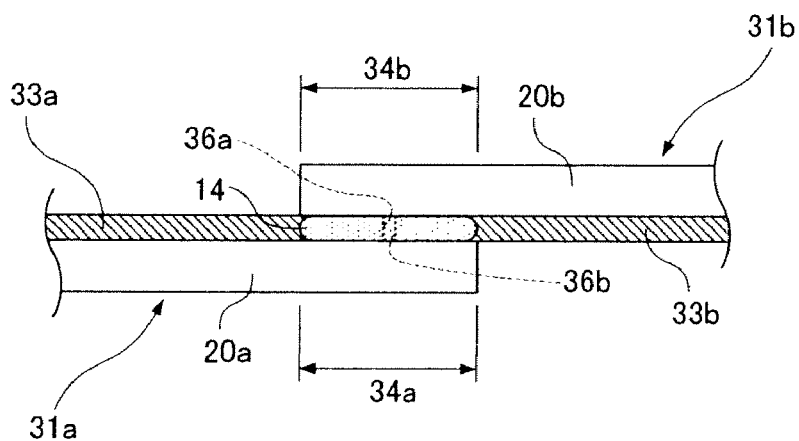
FIG. 3B is a cross-sectional diagram along A-A in FIG. 3A.
Figure 3C:
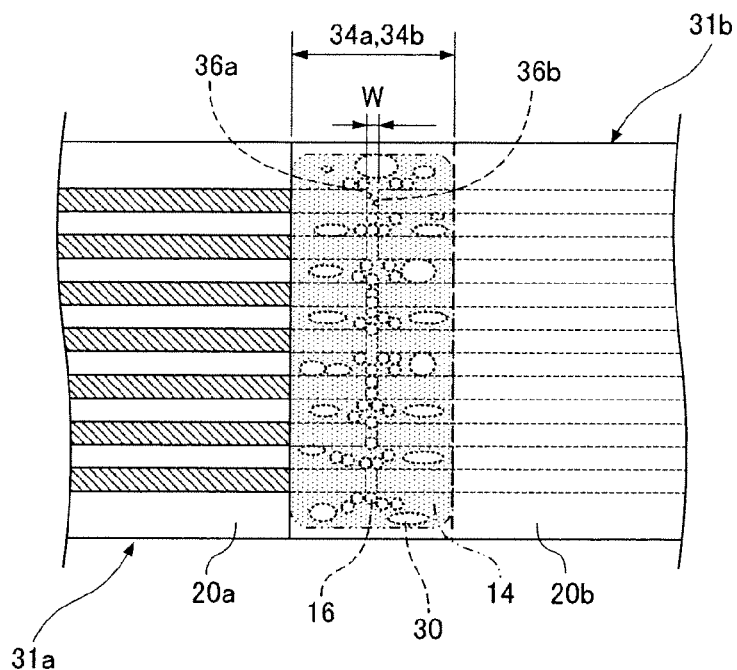
FIG. 3C is a diagram illustrating a step of the method for jointing a circuit board according to the same embodiment.
Figure 3D:
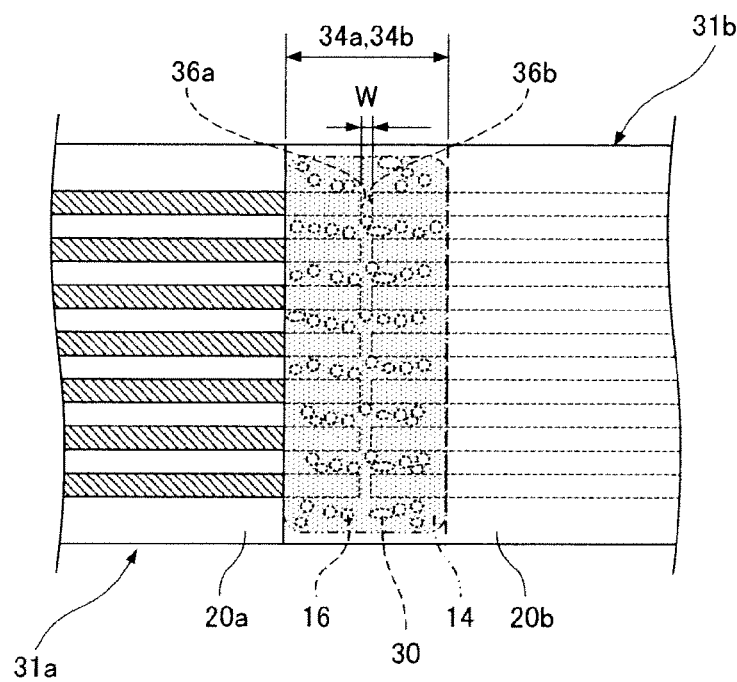
FIG. 3D is a diagram illustrating a step of the method for jointing a circuit board according to the same embodiment.
Figure 3E:
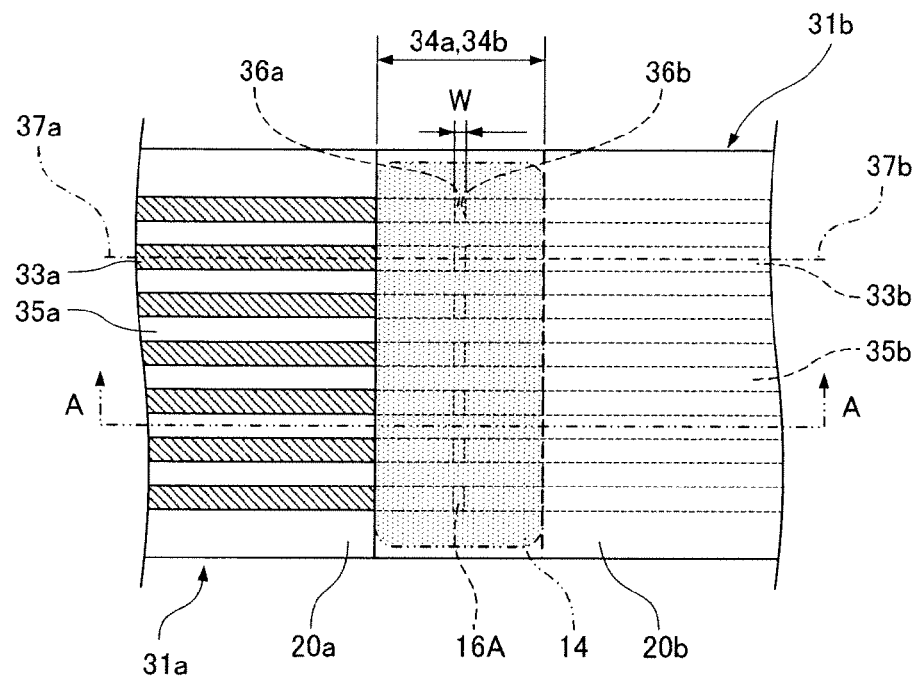
FIG. 3E is a diagram illustrating a step of the method for jointing a circuit board according to the same embodiment.
Figure 3F:
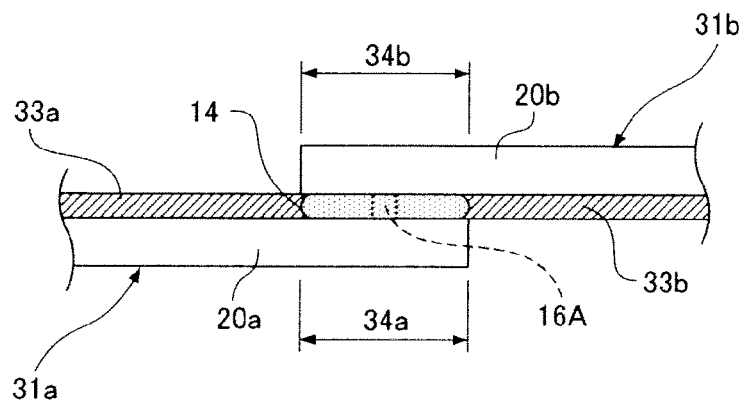
FIG. 3F is a diagram illustrating a step of the method for jointing a circuit board according to the same embodiment based on the cross-sectional diagram along A-A in FIG. 3A.
Figure 17A:
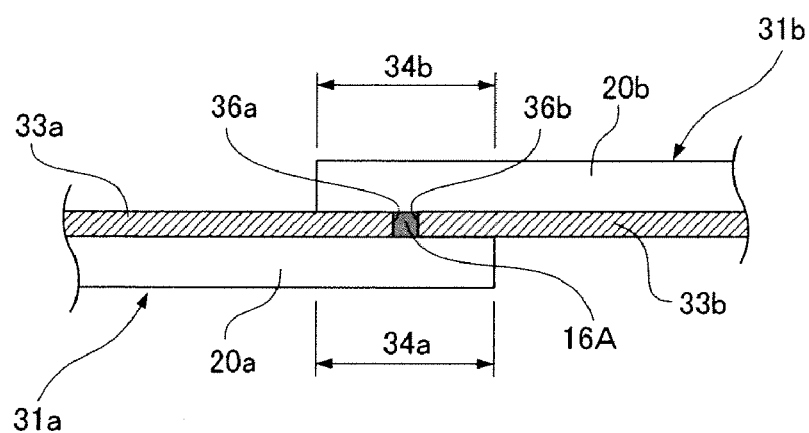
FIG. 17A is a cross-sectional diagram of the circuit board according to the first embodiment of the present invention.
Figure 17B:
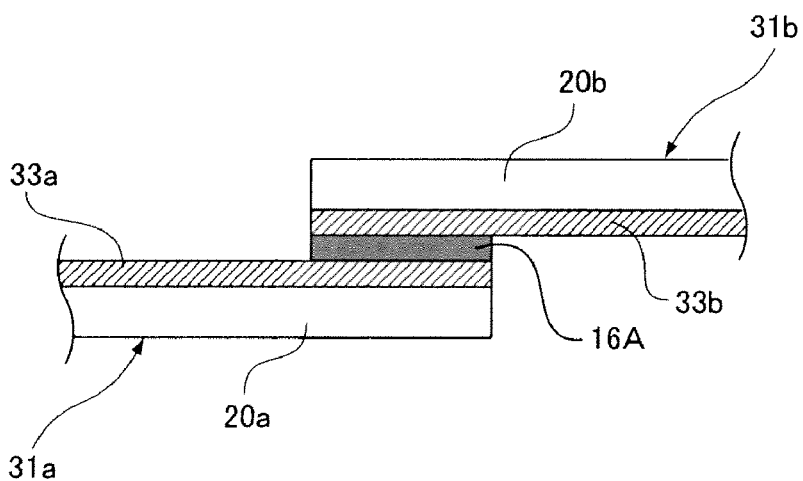
FIG. 17B is a cross-sectional diagram of a circuit board according to the prior art.

FIG. 3E and FIG. 3F are a plan diagram and a front view diagram of a circuit board obtained by jointing the board 31a and the board 31b in an overlapping fashion. FIG. 17A shows a cross-sectional diagram of the overlapping portion of the wires 33a and 33b. Numeral 16A is solder which joins the wires 33a and the wires 33b. In the circuit board according to the first embodiment, the interval between the insulator 20a of the board 31a and an insulator 20b of the board 33b (the gap in the direction of the board thickness) is smaller than in the prior art example (see FIG. 17B) where the wires 33a and wires 33b are joined together by solidified solder 16A interposed therebetween.

This circuit board is formed by jointing the boards 31a and 31b by the following steps.

Figure 2A:
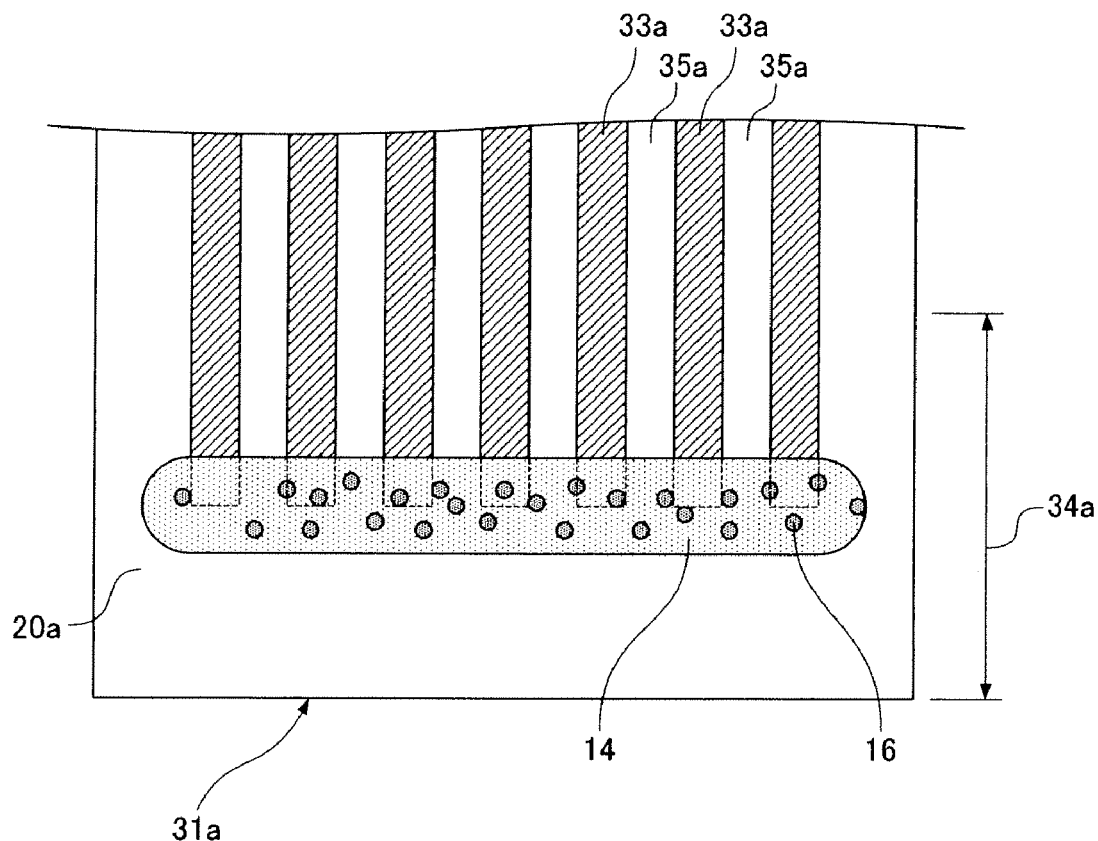
FIG. 2A is a plan diagram illustrating the method for jointing a circuit board according to the same embodiment.
Figure 2B:
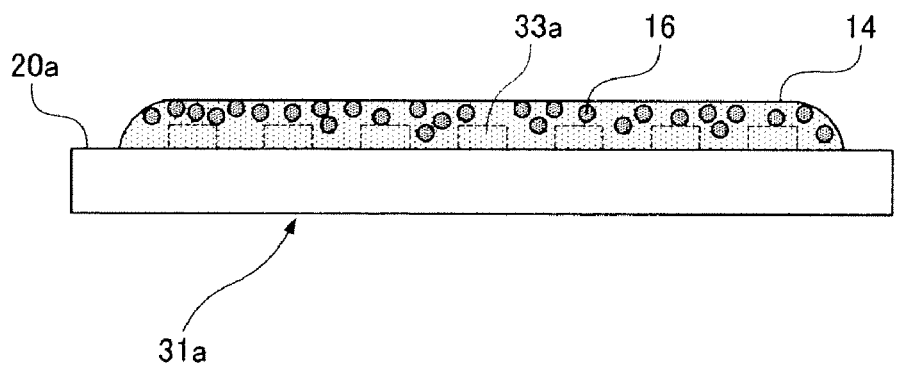
FIG. 2B is a front view diagram of FIG. 2A.

As shown in FIG. 2A and FIG. 2B, a fluid 14 which is a conductive jointing material containing conductive particles 16 and a bubble generating agent (not illustrated) is supplied on top of the connecting terminal 34a. The fluid 14 is supplied in the form of a line whose center lies approximately at the front end position 36a of the wires 33a.

A resin containing conductive particles 16 is used as the fluid 14 according to the first embodiment. Concrete examples of the conductive particles 16 and the bubble generating agent are described hereinafter.

Furthermore, the end portion of the board 31a and the end portion of a separate board 31b to the board 31a are mutually overlapped as shown in FIG. 3A and FIG. 3B, with the wires 33a and 33b disposed to the inner side.

More specifically, the boards are aligned in position in such a manner that the central lines 37a of the wires 33a of the circuit board 31a coincide with the central lines 37b of the wires 33b of the circuit board 31b, and furthermore the front end faces 36a of the wires of the connecting terminal 34a oppose the front end faces 36b of the wires of the connecting terminal 34b. The wire end faces 36a and 36b which are abutted against each other in this way are disposed at a uniform gap W (FIG. 3A) apart, via the fluid 14 which forms a conductive jointing material.

By aligning the positions in this way, a composition is achieved in which the portion of the second region 52 where the wires 33b are not formed and only the insulator 20b of the connecting terminal 34b is present extends into the wires 33a of the connecting terminal 34a, and the portion of the first region 51 where the wires 33a are not formed and only the insulator 20a of the connecting terminal 34a is present extends respectively into the wires 33b of the connecting terminal 34b, and furthermore, the fluid 14 fills into the spatial region of the connecting terminals 34a and 34b.

If the region of the connecting terminals 34a and 34b is heated in a concentrated fashion while holding the boards 31a and 31b so as to maintain the gap W, as shown in FIG. 3A and FIG. 3B, then gas bubbles 30 are generated from the bubble generating agent contained in the fluid 14, as shown in FIG. 3C. The gap W is wider than the particle size of the conductive particles 16 and narrower than the width of the spaces 35a and the spaces 35b. In other words, the distance (gap W) between the end faces of the wires 33a of the circuit board 31a and the end faces of the wires 33b of the circuit board 31b is narrower than the interval between the wires 33a on the circuit board 31a and the interval between the wires 33b on the circuit board 31b.

Furthermore, as shown in FIG. 3B and FIG. 3C, the fluid 14 which has filled into the connection region of the connecting terminal 34a and the connecting terminal 34b can be retained in the region containing the connecting terminals 34a and 34b by the surface tension between the insulators 20a and 20b of respective boards 31a and 31b, and therefore the fluid 14 never spreads out significantly beyond this region.

Next, the description of the processing after the generation of gas bubbles 30 is continued with reference to FIG. 3D and FIG. 3E.

As shown in FIG. 3D, the internal pressure of the gas bubbles 30 generated from the fluid 14 is raised by expansion as they are heated, and the gas bubbles 30 grow or start to move so as to extend toward the outside air where the pressure is lower.

Here, as described above, the central lines 37b of the other wires 33b are aligned in position so as to coincide with the central lines 37a of the wires 33a, and moreover, the end faces 36b of the wires 33b are abutted against the end faces 36a of the wires 33a so as to leave a uniform gap of W therebetween.

The dimensional relationships are: the dimensions of the space 35a and space 35b>gap W>diameter of conductive particles 16. For this reason, the surface tension acting in the gap W is greater than that acting in the spaces 35a and spaces 35b of the region of the connecting terminal 34a and the connecting terminal 34b. By this means, the conductive particles 16 contained in the fluid 14 which moves due to the growth of movement of the gas bubbles 30 assemble in the vicinity of the gap W where the greatest surface tension acts.

When the fluid 14 is heated further, the conductive particles 16 contained in the fluid 14 melt as shown in FIG. 3E, and as a result, the self-assembly of the conductive particles 16 is completed. In other words, the end faces 36a of the wires 33a and the end faces 36b of the wires 33b are jointed by the molten conductive particles.

Thereupon, the molten conductive particles are solidified by ending the application of heat and cooling. By this means, the end faces 36a of the wires 33a and the end faces 36b of the wires 33b are jointed completely by the solder 16A as shown in FIG. 17A.

As shown in FIG. 3F, which is a cross-sectional diagram along A-A in FIG. 3E, the fluid 14 apart from the conductive particles which have melted and solidified extends respectively over the insulator 20b of the connecting terminal 34b and the wires 33a of the connecting terminal 34a, and over the insulator 20a of the connecting terminal 34a and the wires 33b of the connecting terminal 34b, and thereby functions so as to bond these respectively to each other. Consequently, the portion where the end faces 36a of the wires 33a and the end faces 36b of the wires 33b are jointed together is reinforced and hence satisfactory jointing of the circuit board 31a and the circuit board 31b can be achieved.

Figure 13A:
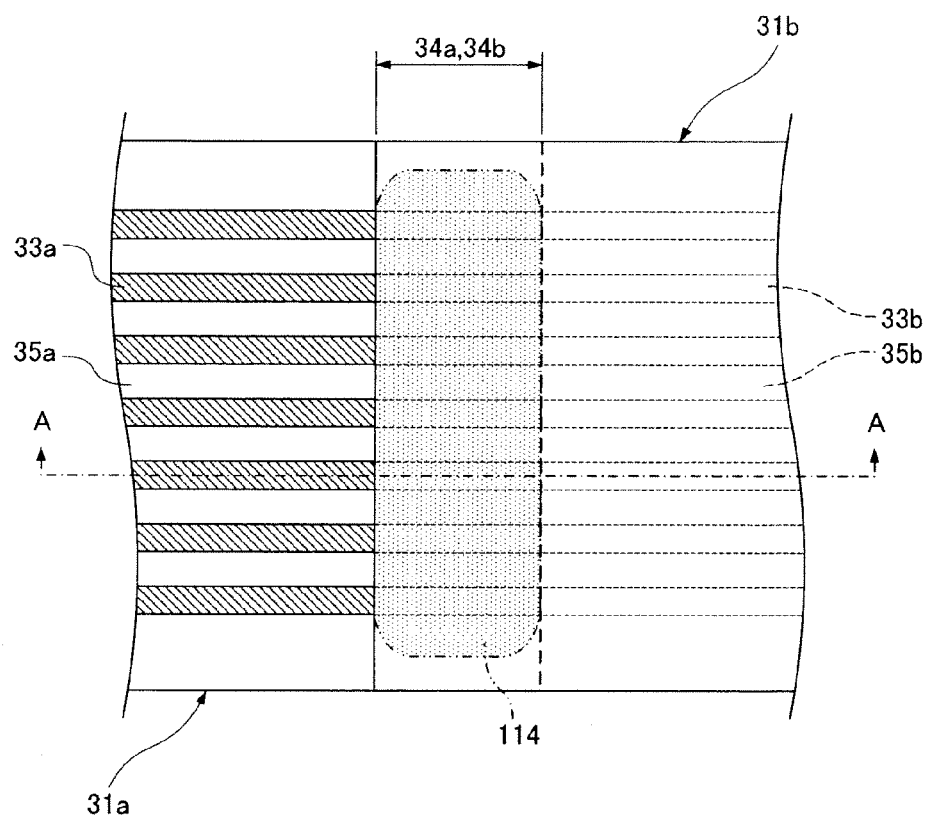
FIG. 13A is a plan diagram illustrating the method of jointing circuit boards by using self-assembly of resin.
Figure 13B:
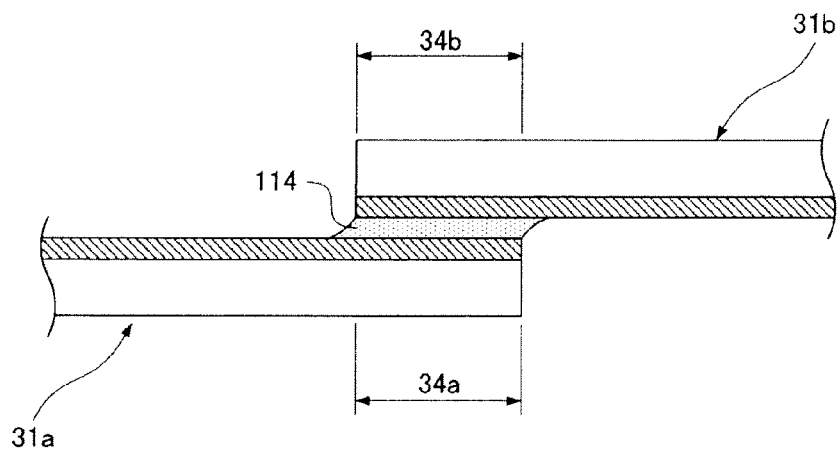
FIG. 13B is a cross-sectional diagram along A-A in FIG. 13A.
Figure 14:
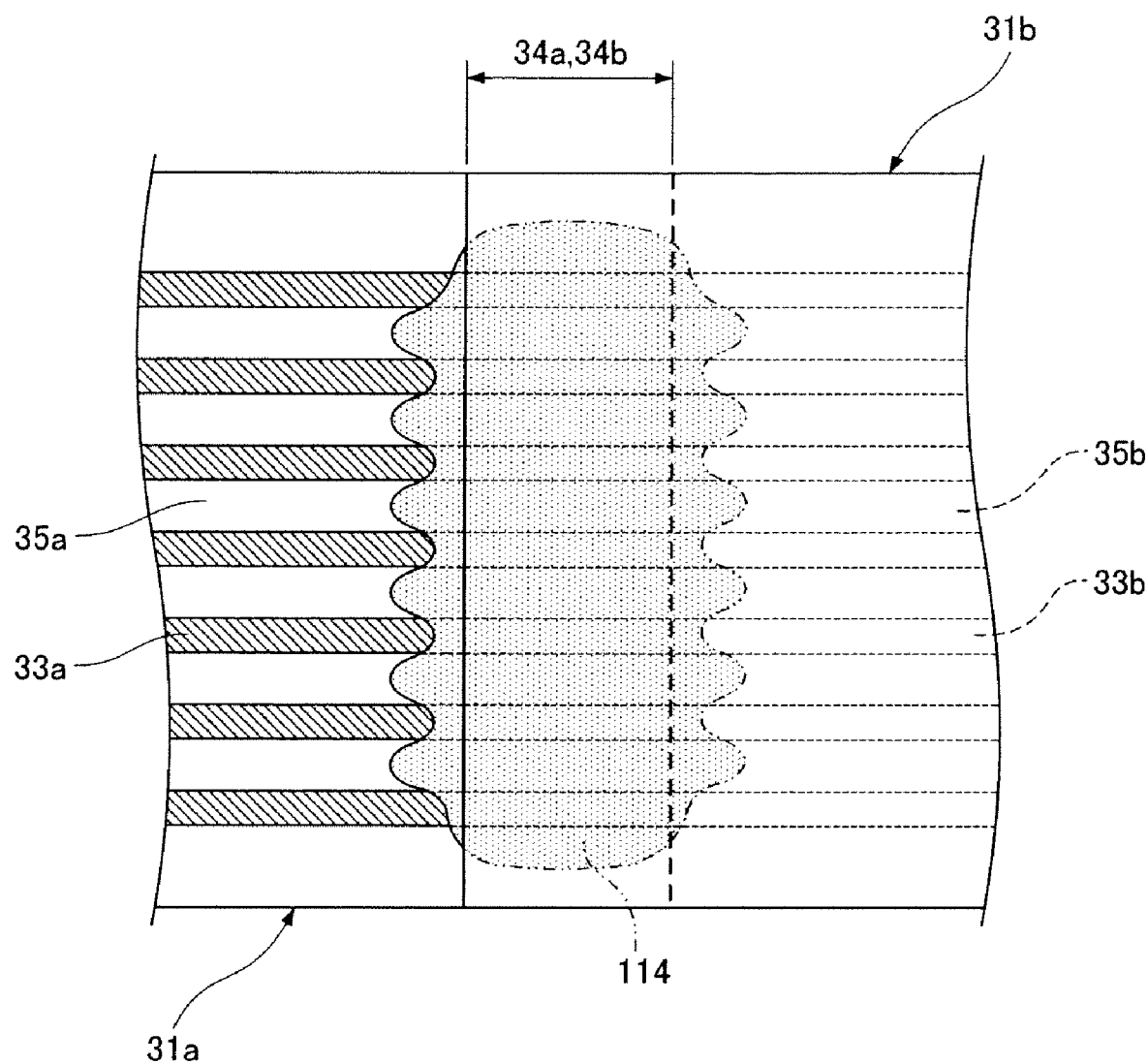
FIG. 14 is a plan diagram showing a state where resin and solder powder have been pushed out from the connection region according to the prior art method.
Figure 15:
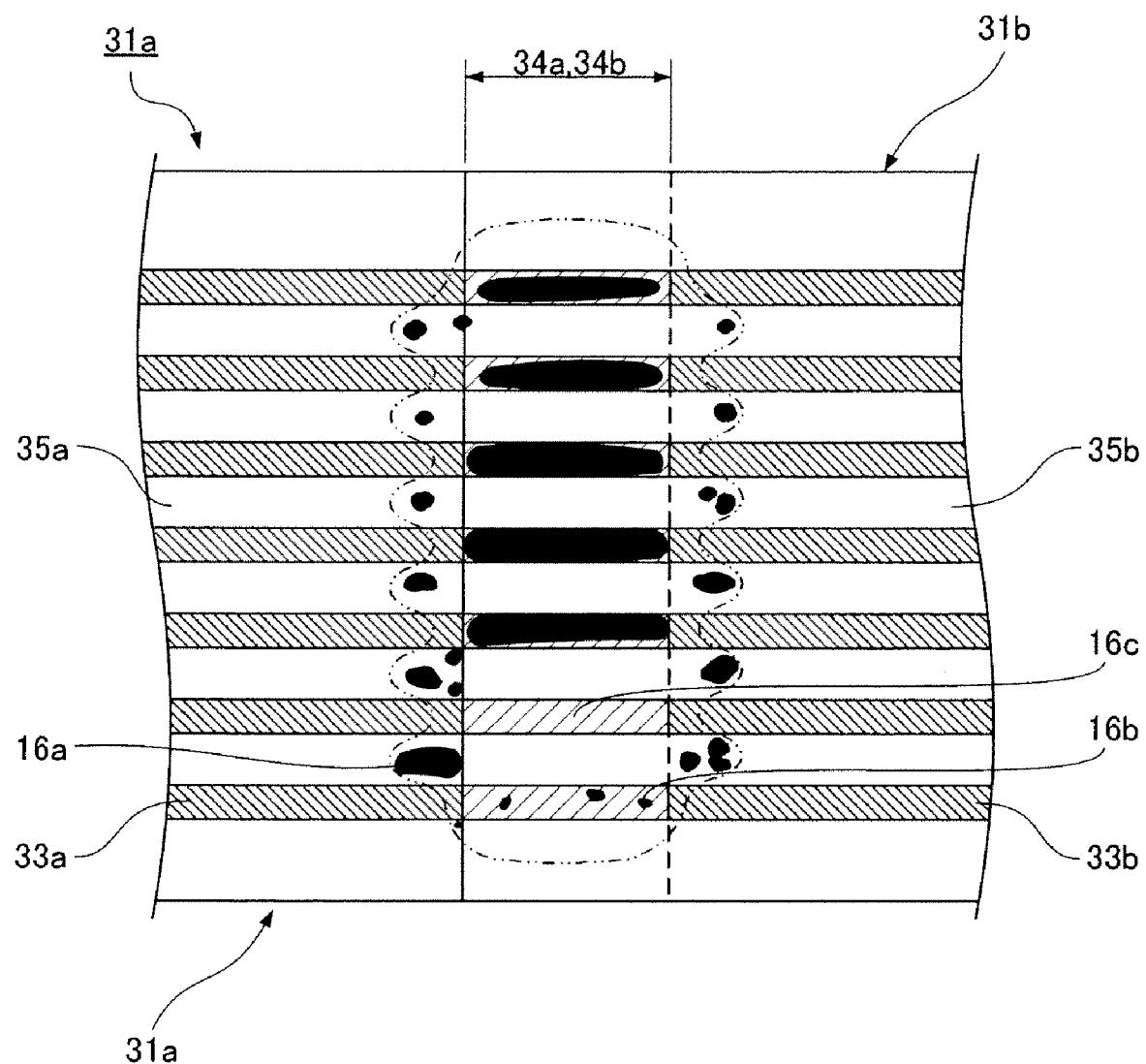
FIG. 15 is a diagram illustrating the state of solder powder after it has assembled and then melted and solidified according to the prior art method.
Figure 16A:
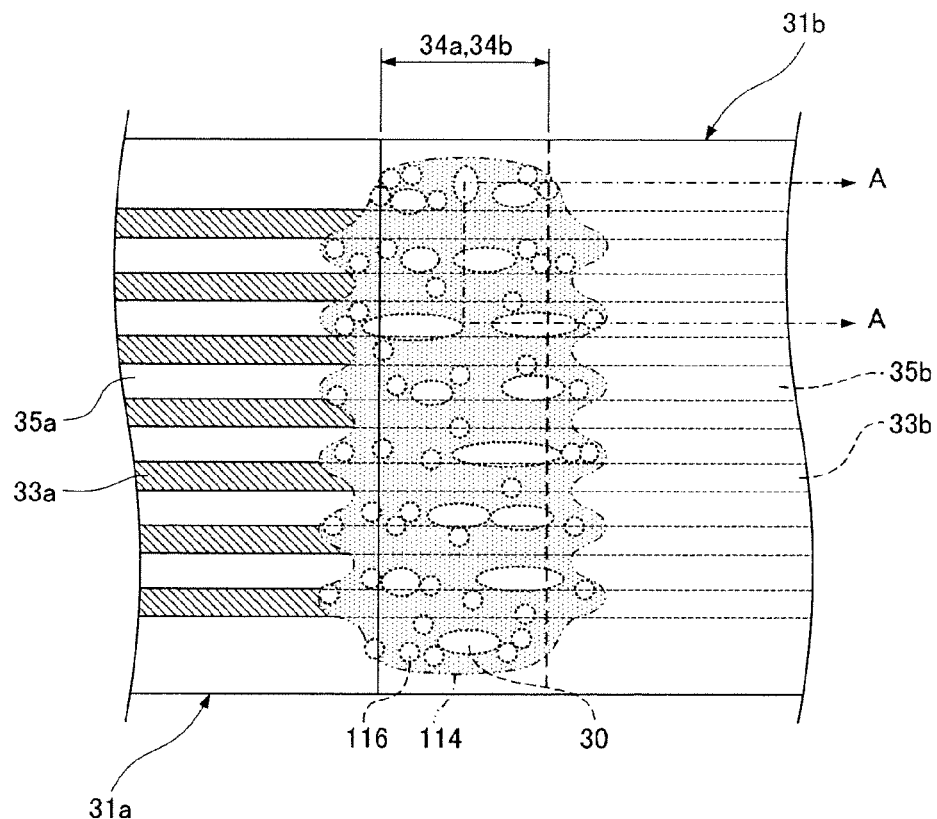
FIG. 16A is a plan diagram illustrating the reasons for the formation of irregular shapes of solder powder constituting conductive particles according to the prior art method.
Figure 16B:
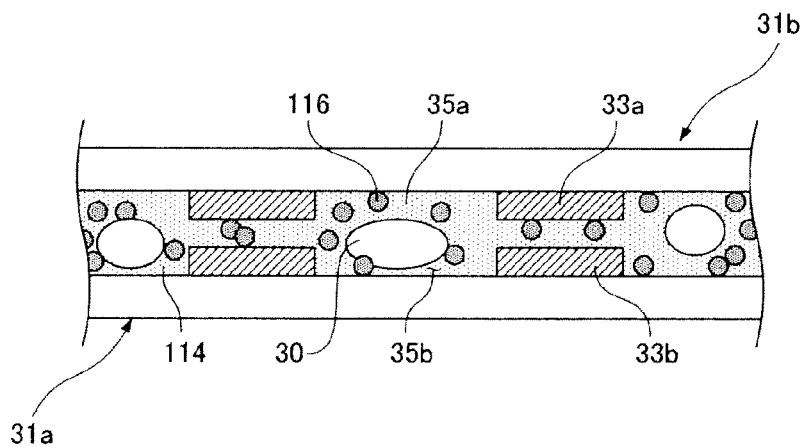
FIG. 16B is a cross-sectional diagram along A-A in FIG. 16A.

The reason why the solder powder constituting conductive particles forms irregular shapes on the circuit board, which is a problem relating to the prior art discovered by the present inventors, is described here with reference to FIG. 16A and FIG. 16B, which give a detailed illustration of the prior art examples in FIG. 13 to FIG. 15.

When a resin 114 is heated in the state shown in FIG. 13A and FIG. 13B, gas bubbles 30 are produced from the bubble generating agent contained in the resin 114. The gas bubbles 30 thus produced move while pushing aside solder powder 116 in the resin 114. Moreover, the gas bubbles 30 grow and, with increasing speed of movement, are expelled to the outside of the connection region of the connecting terminals 34a and 34b along the wires 33a and the wires 33b. If the gas bubbles 30 move at a slow pace, then the solder powder 116 which is originally meant to be pushed aside by the gas bubbles 30 and made to assemble between the wires 33a and the wires 33b actually flows outside the connecting region together with the resin 114 and melts and solidifies there. If the solder powder 116 which is meant to be assembled between the connecting terminals 34a and 34b is pushed out in this way, then insufficiencies arise in the amount of solder for connecting the wires 33a and 33b, and hence portions of insufficient solder or unconnected portions occur between the connecting terminals.

The reason for this is thought to be that although the gap of the spaces 35a and spaces 35b is determined by the wires 33a and the wires 33b and the interval between same, due to the large width of these gaps, it has not been possible to restrict the growth of the gas bubbles 30 and their speed of movement on the basis of the surface tension acting on the resin 114 and the viscosity of the resin 114.

In response to the problem described above, in the present embodiment, by adopting a composition in which the gaps of the spaces 35a and spaces 35b described above are narrowed, outflow of the fluid 14 to the exterior of the connection region is avoided due to the restricted growth and speed of movement of the gas bubbles, and hence the solder powder self-assembles between the front end faces 36a and 36b of the wires. Therefore, the problems of assembly of the solder outside of the connection region, or the occurrence of insufficient solder or unconnected solder in the connecting terminals, can be resolved.

For these reasons, even when jointing together circuit boards, it is possible to achieve electrical connections with excellent uniformity and high productivity. Moreover, since a composition is adopted in which the front end faces of wires are abutted against each other, then it is possible to make the connecting section thinner in comparison with a conventional composition where the wires are mutually superimposed.

The action described above is not limited by the specific composition of the fluid 14. However, it is possible to use the following materials, respectively.

The fluid 14 should be one having a viscosity that allows fluid movement within a temperature range from room temperature to the melting point of the conductive particles 16, or one which falls to a viscosity that allows fluid movement when heated. Typical examples of the fluid are: thermally curable resins such as epoxy resin, phenol resin, silicone resin, diallyl phthalate resin, furan resin, melamine resin, or the like, thermoplastic resins such as polyester elastomer, fluorine resin, polyimide resin, polyamide resin, aramide resin, or the like, a light (ultraviolet)-curable resin, or a material combining these.

Furthermore, it is possible to use the materials shown in FIG. 4 and FIG. 5 in suitable combination, for the conductive particles 16 and the bubble generating agent.

If a material is used in which the melting point of the conductive particles 16 is higher than the boiling point of the bubble generating agent, then the fluid 14 is heated, gas bubbles are generated from the bubble generating agent and the fluid is caused to self-assemble, whereupon the fluid 14 is heated further and the conductive particles in the fluid which have self-assembled can be melted and metallic bonds can be formed between the conductive particles.

Furthermore, the bubble generating agent may be made of materials of two or more types having different boiling points. If the boiling points are different, then there is a difference in the timing at which gas bubbles are produced and grow, and consequently, the movement of the fluid 14 caused by the growth of the gas bubbles occurs in a stepwise fashion. Therefore, it is possible to joint circuit boards stably by making the self-assembling process of the fluid 14 uniform.

For the bubble generating agent, apart from the materials cited in FIG. 5, it is also possible to use a material which generates gas bubbles due to pyrolysis of the bubble generating agent when the fluid 14 is heated. The materials cited in FIG. 6 can be used as a bubble generating agent of this kind. For example, if a compound containing crystallization water (aluminum hydroxide) is used, then the compound pyrolyzes when the fluid 14 is heated, and water vapor is generated in the form of bubbles.

Furthermore, in the respective diagrams which illustrate the steps described above, the amount of fluid 14 supplied is depicted in exaggerated fashion, and in actual practice, an amount which is suitable for self-assembly between the connecting terminals 34a and 34b and which allows for errors is supplied. Here, as one example of the fluid 14, it is possible to use 50 wt % of solder powder, 45 wt % of epoxy resin (including a curing agent), and 5 wt % remainder (active agent, bubble generating agent, or the like).

In the first embodiment described above, after supplying the fluid 14 onto the connecting terminal 34a, the connecting terminal 34b is placed in position, but the invention is not limited to this and it is also possible to position the wire ends opposing each other in advance, so as to create a gap W, and to then supply the fluid 14 containing conductive particles 16 and a bubble generating agent. In summary, the present invention is not restricted by the sequence of the steps of aligning the positions of the circuit boards.

Second Embodiment

Figure 7A:
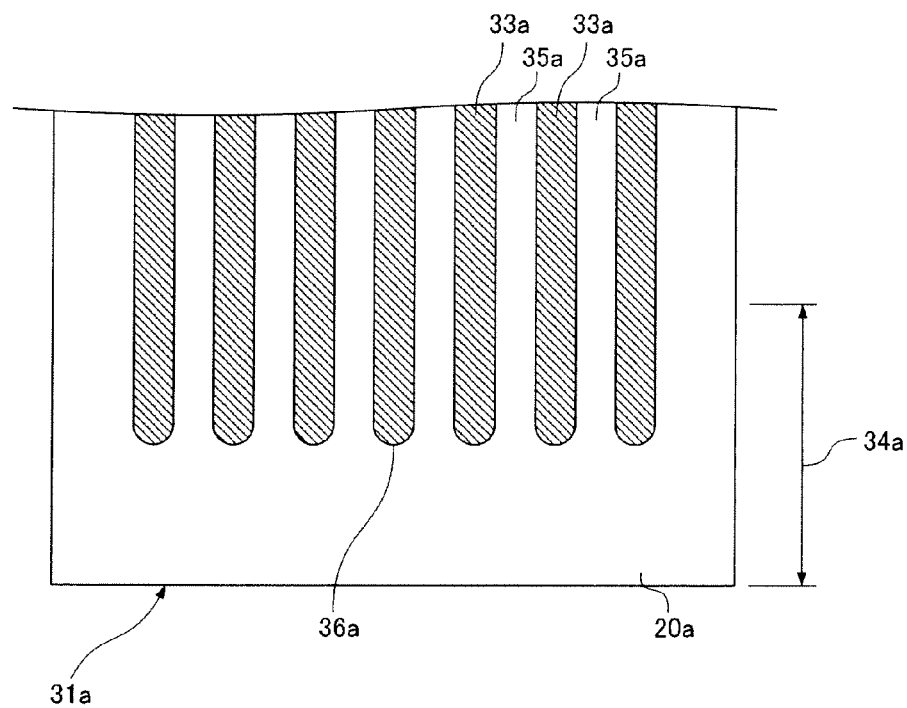
FIG. 7A is a plan diagram illustrating a method for jointing a circuit board according to a second embodiment of the present invention.
Figure 7B:
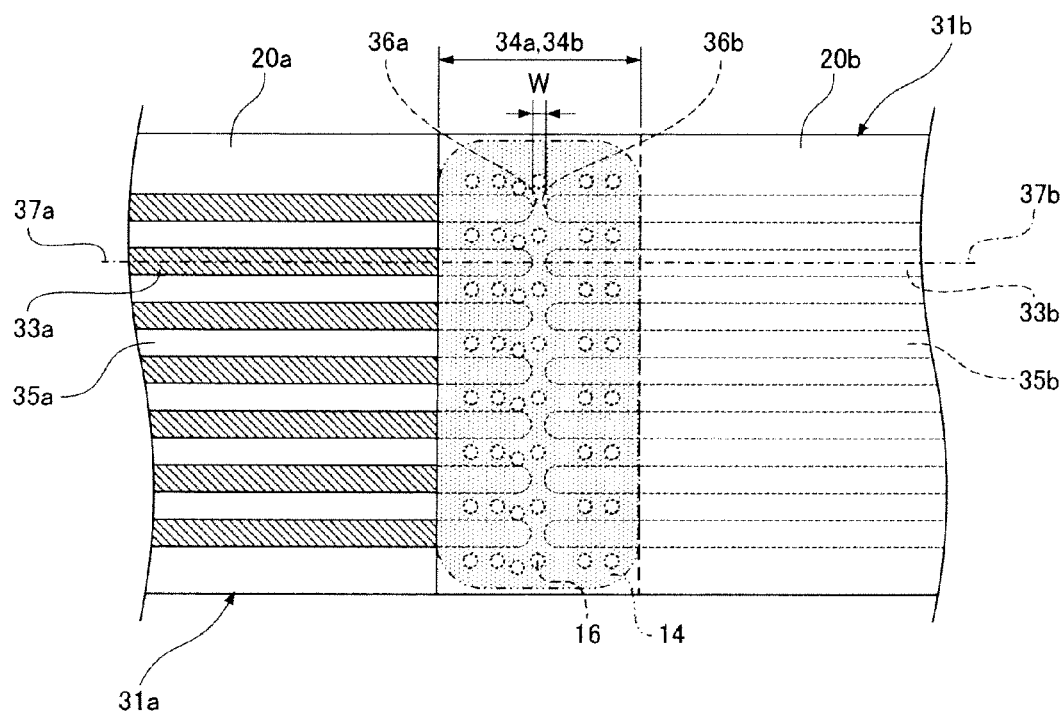
FIG. 7B is a plan diagram illustrating the method for jointing a circuit board according to the same embodiment.

FIG. 7A and FIG. 7B show a second embodiment of the present invention.

The planar shape of the respective end portions 36a and 36b of the wires 33a and 33b according to the first embodiment is a straight line shape, but in this second embodiment, the planar shape of the respective end portions of the wires 33a and 33b is a circular arc shape. Apart from this, the embodiment is the same as the first embodiment.

In FIG. 7B, the fluid 14 is applied, the respective positions are aligned in such a manner that the central lines 37a of wires 33a of a circuit board 31a and the central lines 37b of wires 33b of another circuit board 31b opposing same coincide with each other, and the end faces 36b in the connecting terminal 34a are disposed so as to oppose the end faces 36b in the connecting terminal 34a. The end faces 36a and 36b which are abutted against each other in this way are disposed at a uniform interval W apart, via the fluid 14. The fluid 14 used is the same as that of the first embodiment.

By aligning the positions in this way, a composition is achieved in which the insulator 20b of the connecting terminal 34b extends into the wires 33a of the connecting terminal 34a and the insulator 20a of the connecting terminal 34a extends respectively into the wires 33b of the connecting terminal 34b, in addition to which the fluid 14 is filled into the space region of the connecting terminals 34a and 34b. When the fluid 14 is heated in this state, similarly to the first embodiment, the end faces 36a of the wires 33a and the end faces 36b of the wires 33b are jointed together completely by the melting and solidification of the conductive particles 16. Here, since the front ends of the wires 33a and 33b which are abutted together have a rounded shape, then the resulting grooves in which the gap W gradually reduces from the outer sides of the wires 33a and 33b toward the center of the wires facilitate the assembly of the conductive particles 16.

Furthermore, since the insulator 20b of the connecting terminal 34b and the wires 33a of the connecting terminal 34a, and the insulator 20a of the connecting terminal 34a and the wires 33b of the connecting terminal 34b extend mutually into each other, then the insulators 20a and 20b are bonded respectively together by the resin component which is left in the fluid 14 due to the assembly of the hardened conductive particles 16 in between the wires 33a and 33b. Consequently, the portion where the end faces 36a of the wires 33a and the end faces 36b of the wires 33b are jointed together by the molten conductive particles is reinforced and hence satisfactory jointing of the circuit board 31a and the circuit board 31b can be achieved.

In the second embodiment described above, funnel-shaped grooves are formed by abutting wires 33a and 33b which have end faces curved in a circular arc shape, but the invention is not limited to this and it is also possible to form the ends of the wires 33a and 33b with a trapezoid shape. In summary, the end faces of the wires 33a and 33b should form funnel-shaped grooves when abutted against each other.

Third Embodiment

Figure 8A:
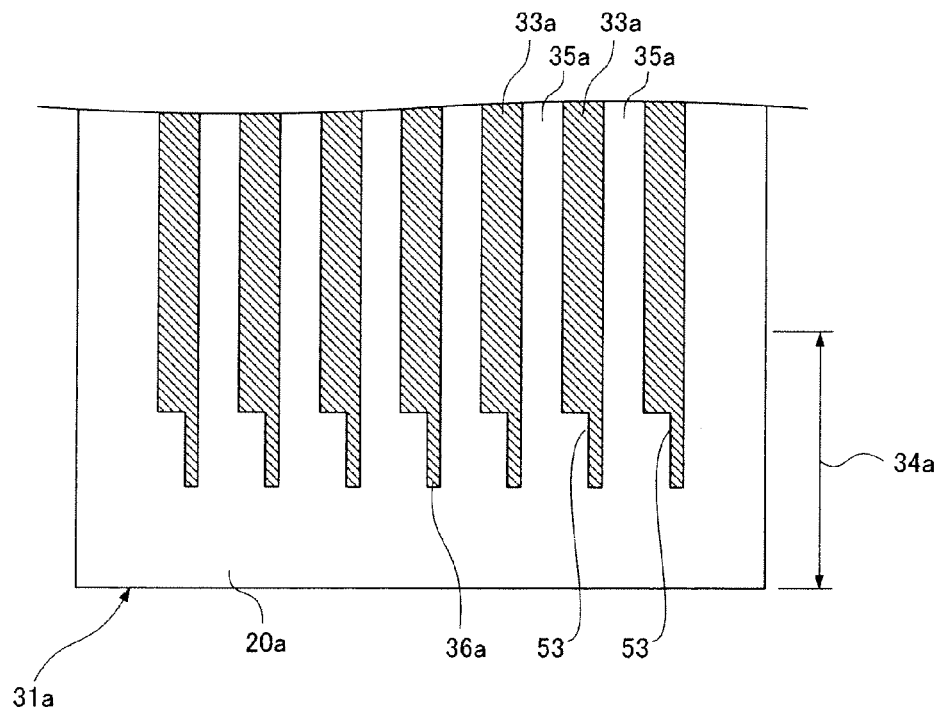
FIG. 8A is a plan diagram illustrating a method for jointing a circuit board according to a third embodiment of the present invention.
Figure 8B:
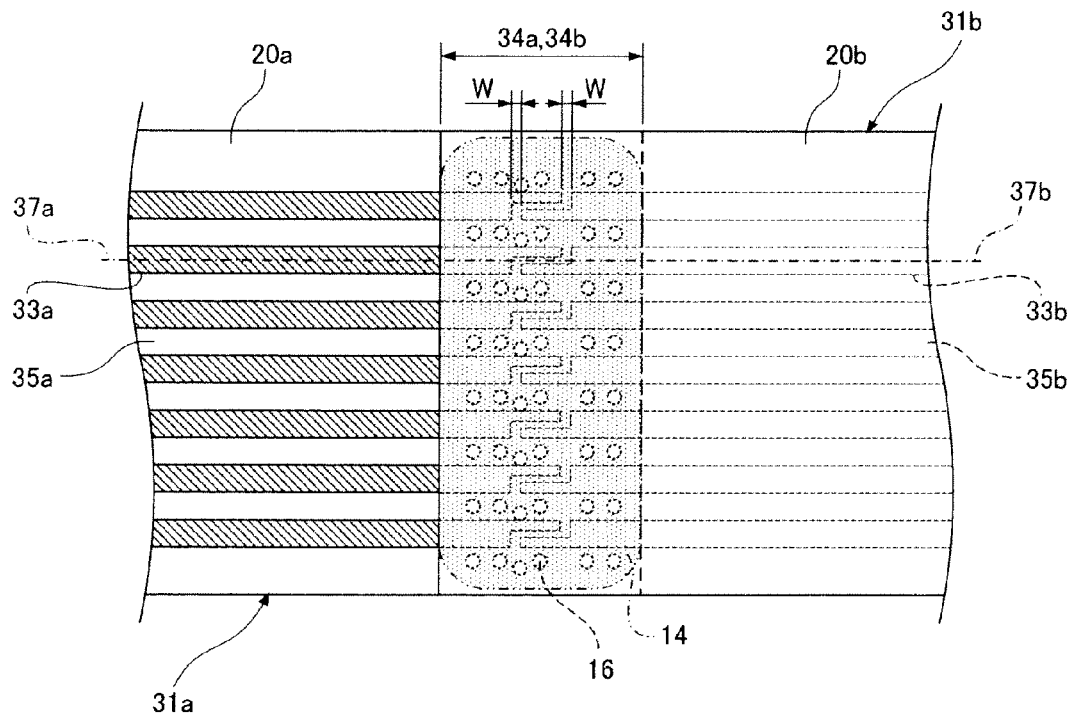
FIG. 8B is a plan diagram illustrating the method for jointing a circuit board according to the same embodiment.
Figure 9A:
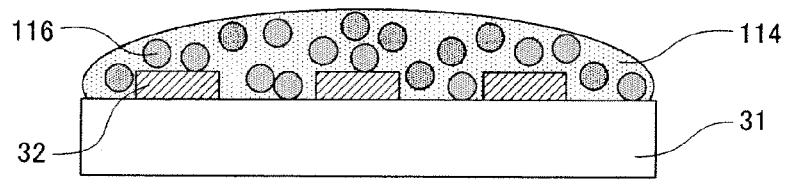
FIG. 9A is a cross-sectional diagram showing basic steps of a prior art method for forming bumps using self-assembly of resin.
Figure 9B:
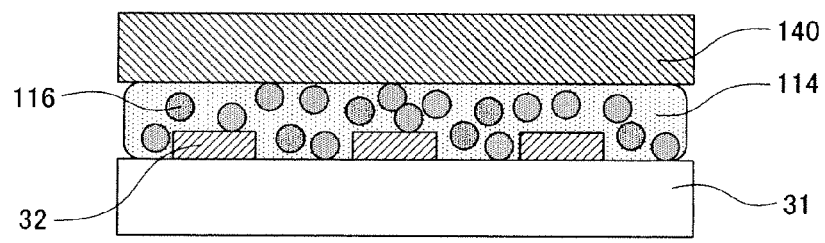
FIG. 9B is a cross-sectional diagram showing the basic steps of the prior art method for forming bumps.
Figure 9C:
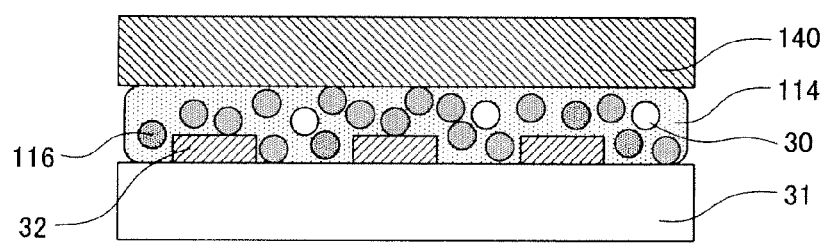
FIG. 9C is a cross-sectional diagram showing the basic steps of the prior art method for forming bumps.
Figure 9D:
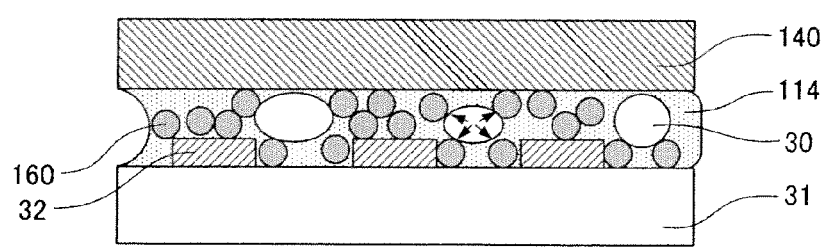
FIG. 9D is a cross-sectional diagram showing the basic steps of the prior art method for forming bumps.
Figure 10A:
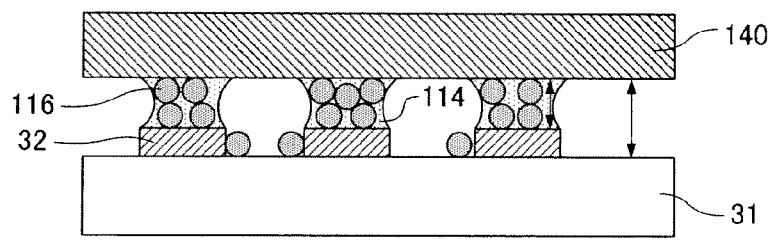
FIG. 10A is a cross-sectional diagram showing the basic steps of the prior art method for forming bumps.
Figure 10B:
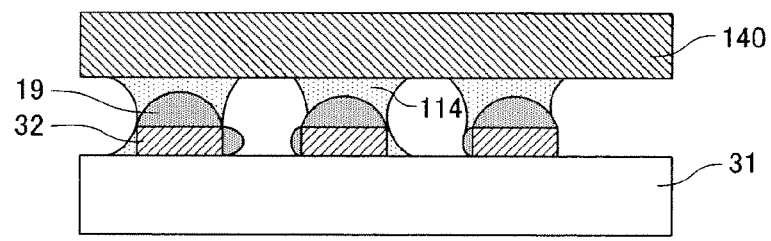
FIG. 10B is a cross-sectional diagram showing the basic steps of the prior art method for forming bumps.
Figure 10C:
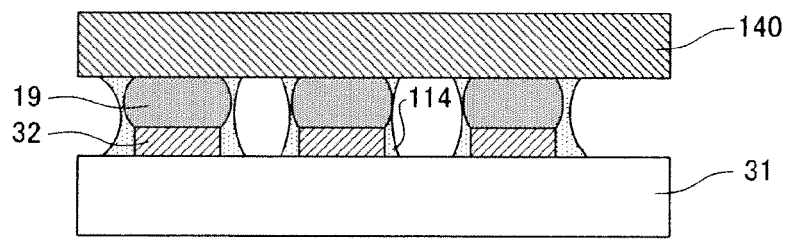
FIG. 10C is a cross-sectional diagram showing the basic steps of the prior art method for forming bumps.
Figure 10D:
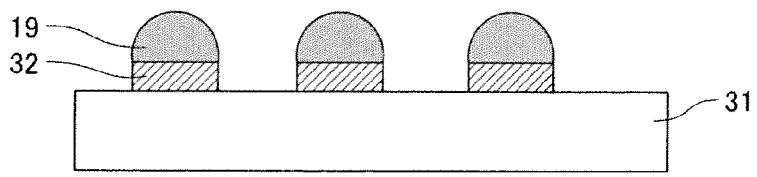
FIG. 10D is a cross-sectional diagram showing the basic steps of the prior art method for forming bumps.
Figure 11A:
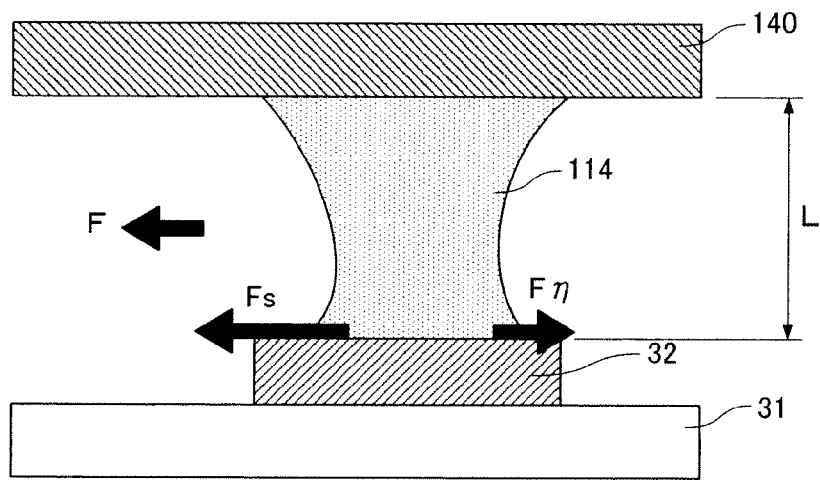
FIG. 11A is a diagram illustrating the mechanism of self-assembly of resin according to the prior art method.
Figure 11B:
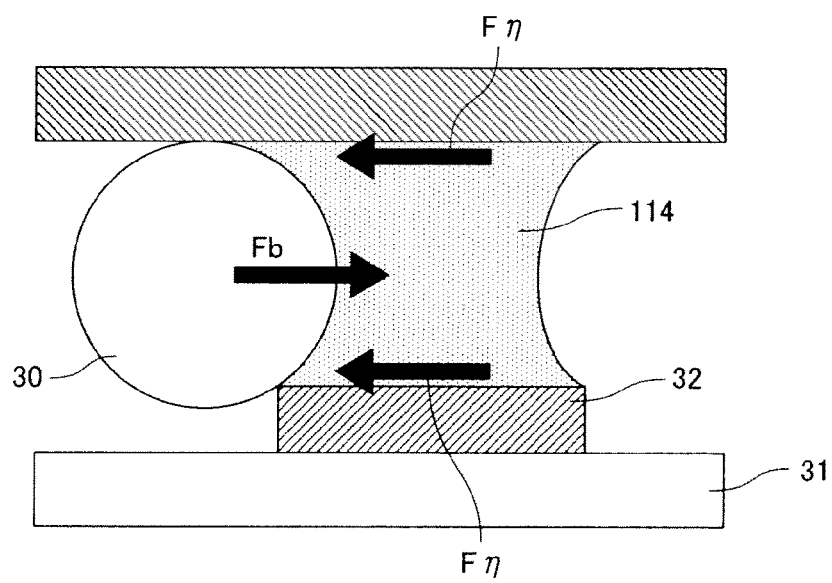
FIG. 11B is a diagram illustrating the mechanism of self-assembly of a resin according to the prior art method.
Figure 12:
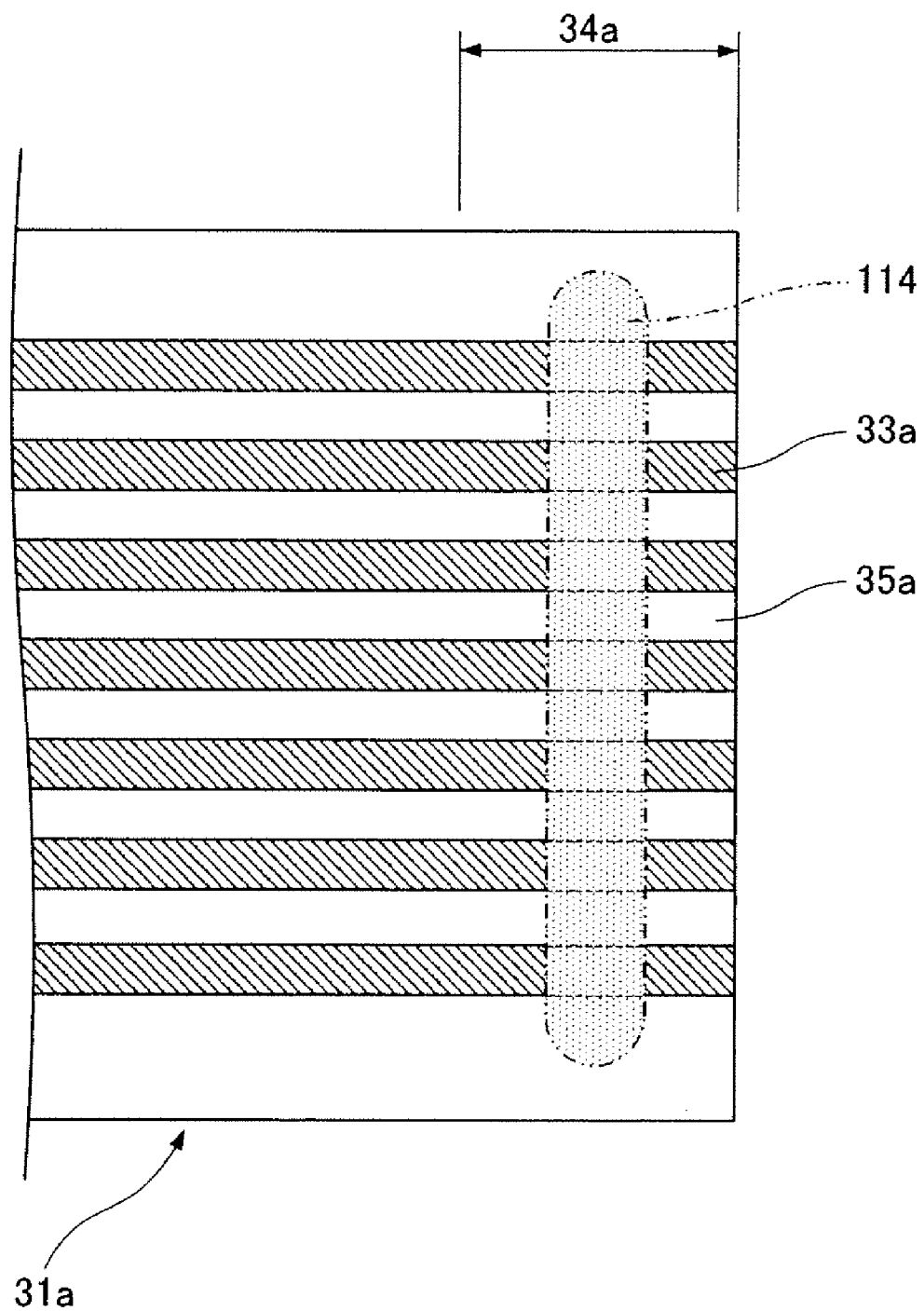
FIG. 12 is a plan diagram illustrating a method of jointing circuit boards by using self-assembly of resin.

FIG. 8A and FIG. 8B show a third embodiment of the present invention.

The planar shape of the respective end portions of the wires 33a and 33b of the first embodiment is a straight line shape, but the third embodiment differs from this in that a cutaway 53 is formed in the end portion of each wire 33a and 33b, whereby the planar shape of each end portion is formed in a key shape and the opposing length of the end faces is increased. Apart from this, the embodiment is the same as the first embodiment.

In FIG. 8A, the circuit board 31a has a plurality of wires 33a arranged on an insulator 20a, and the region indicated by the arrow in FIG. 8A is a connecting terminal 34a which is formed only by the wires 33a and the insulator 20a which does not contain any wires 33a. The end faces 36a of the wires 33a are positioned at 0.4 mm from the end of the circuit board 31a, and the length of the connecting terminal 34a including the wires 33a is 1.0 mm. Furthermore, cutaway sections having a longer edge of 0.2 mm and a shorter edge of 0.03 mm are provided in the front end portion of each of the wires 33a. The width of the wires 33a is 0.05 mm and the width of the spaces 35a between the mutually adjacent wires 33a is 0.05 mm. Consequently, the wires 33a are formed using a wiring rule of 0.1 mm pitch. Furthermore, the thickness of the wires 33a is approximately 15 μm (nickel/gold plating 3 μm thick on top of copper foil 12 μm).

In FIG. 8B, the respective positions are aligned in such a manner that the central lines 37a of wires 33a of a circuit board 31a and the central lines 37b of wires 33b of another circuit board 31b opposing same coincide with each other, and the end faces 36b in the connecting terminal 34b are disposed so as to oppose the cutaway sections 53 of the wires 33a in the connecting terminal 34a. In this case, the fluid 14 has already been applied, and the end faces 36a and end faces 36b with their respective cutaway sections 53 abutting against each other are positioned so as to form a uniform gap W therebetween via the fluid 14. The fluid 14 used is the same as that of the first embodiment.

By aligning the positions in this way, a composition is achieved in which the insulator 20b of the connecting terminal 34b extends into the wires 33a of the connecting terminal 34a and the insulator 20a of the connecting terminal 34a extends respectively over the wires 33b of the connecting terminal 34b, in addition to which the fluid 14 is filled into the space region of the connecting terminals 34a and 34b. When the fluid 14 is heated in this state, similarly to the first embodiment, the end faces 36a of the wires 33a and the end faces 36b of the wires 33b are jointed together completely by the melting and solidification of the conductive particles 16. Here, since the wires 33a and 33b are abutted against each other after forming cutaway sections in the front end portions thereof, then it is possible to increase the respective joint lengths and therefore the reliability of the joint formed by the conductive particles 16 can be improved.

Furthermore, since the insulator 20b of the connecting terminal 34b and the wires 33a of the connecting terminal 34a, and the insulator 20a of the connecting terminal 34a and the wires 33b of the connecting terminal 34b extend mutually into each other, then the insulators 20a and 20b are bonded respectively together by the resin component which is left in the fluid 14 due to the assembly of the hardened conductive particles 16 in between the wires 33a and 33b. Consequently, the portion where the end faces 36a of the wires 33a and the end faces 36b of the wires 33b are jointed together by the molten conductive particles is reinforced and hence satisfactory jointing of the circuit board 31a and the circuit board 31b can be achieved.

In the third embodiment, the joint length is increased by abutting wires 33a and 33b which have end portions provided with a cutaway 53, but as shown in FIGS. 18A to 18E, it is also possible to form the ends of the wires 33a and 33b so as to increase the joint length.

Figure 18:
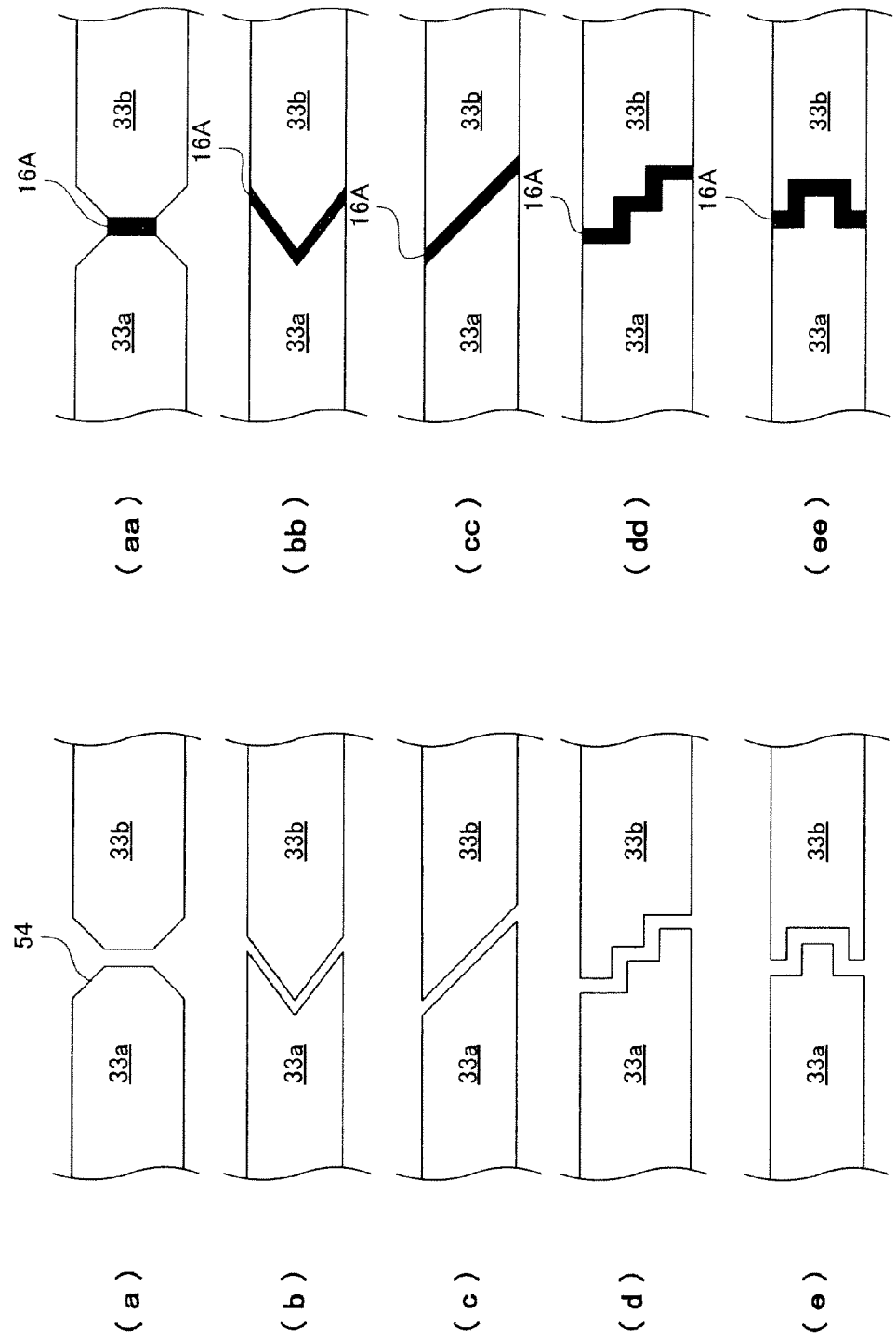
FIGS. 18A to 18E and FIGS. 18AA to 18EE are plan diagrams showing the shape of connecting terminals according to further embodiments, being explanatory diagrams of the state of connection.

More specifically, the shape of the end faces 36a and 36b in FIG. 18A is such that the wires 33a and 33b oppose each other in a straight line shape at a gap of W in the center of the wires, and have oblique surfaces 54 whereby the gap W increases gradually from the center toward the outer sides. FIG. 18AA shows the state of a wire 33a and a wire 33b jointed by solder 16A which has assembled and solidified.

The shape of the end faces 36a and 36b in FIG. 18B comprises oblique surfaces which are inclined toward the outer sides from the centers of the wires 33a and 33b, the gap W being uniform in the breadthways direction of the wires 33a and 33b. FIG. 18BB shows the state of a wire 33a and a wire 33b jointed by solder 16A which has assembled and solidified.

The shape of the end faces 36a and 36b in FIG. 18C comprises an oblique surface which is inclined in one direction, the gap W being uniform in the breadthways direction of the wires 33a and 33b. FIG. 18CC shows the state of a wire 33a and a wire 33b jointed by solder 16A which has assembled and solidified.

The shape of the end faces 36a and 36b in FIG. 18D comprises an oblique surface which is inclined in a stepwise fashion, the gap W being uniform in the breadthways direction of the wires 33a and 33b. FIG. 18DD shows the state of a wire 33a and a wire 33b jointed by solder 16A which has assembled and solidified.

The shape of the end faces 36a and 36b in FIG. 18E is a concavoconvex shape, the gap W being uniform in the breadthways direction of the wires 33a and 33b. FIG. 18EE shows the state of a wire 33a and a wire 33b jointed by solder 16A which has assembled and solidified.

In the respective embodiments described above, the positions of the end faces 36a of the plurality of mutually adjacent wires 33a provided with a space 35a therebetween on the board 31a are positions that are withdrawn by the same distance from the end of the board 31a, the positions of the end faces 36b of the plurality of wires 33b provided with a space 35b therebetween on the board 31b are also positions that are withdrawn by the same distance from the end of the board 31b, and the positions of the joints between the wires 33a and the wires 33b formed by the solder 16A that has assembled and solidified are the same position from the ends of the boards 31a and 31b; however, by locating the joints between the wires 33a and the wires 33b formed by the assembled and solidified solder 16A at different positions from the end of the board 31a, in mutually adjacent wires of the wires 33a, it is possible to achieve compatibility with narrowing of the pitch of the spaces 35a and 35b. Taking the case of FIG. 18A as an example, a concrete example will now be described with reference to FIGS. 19A and 19B.

Figure 19:
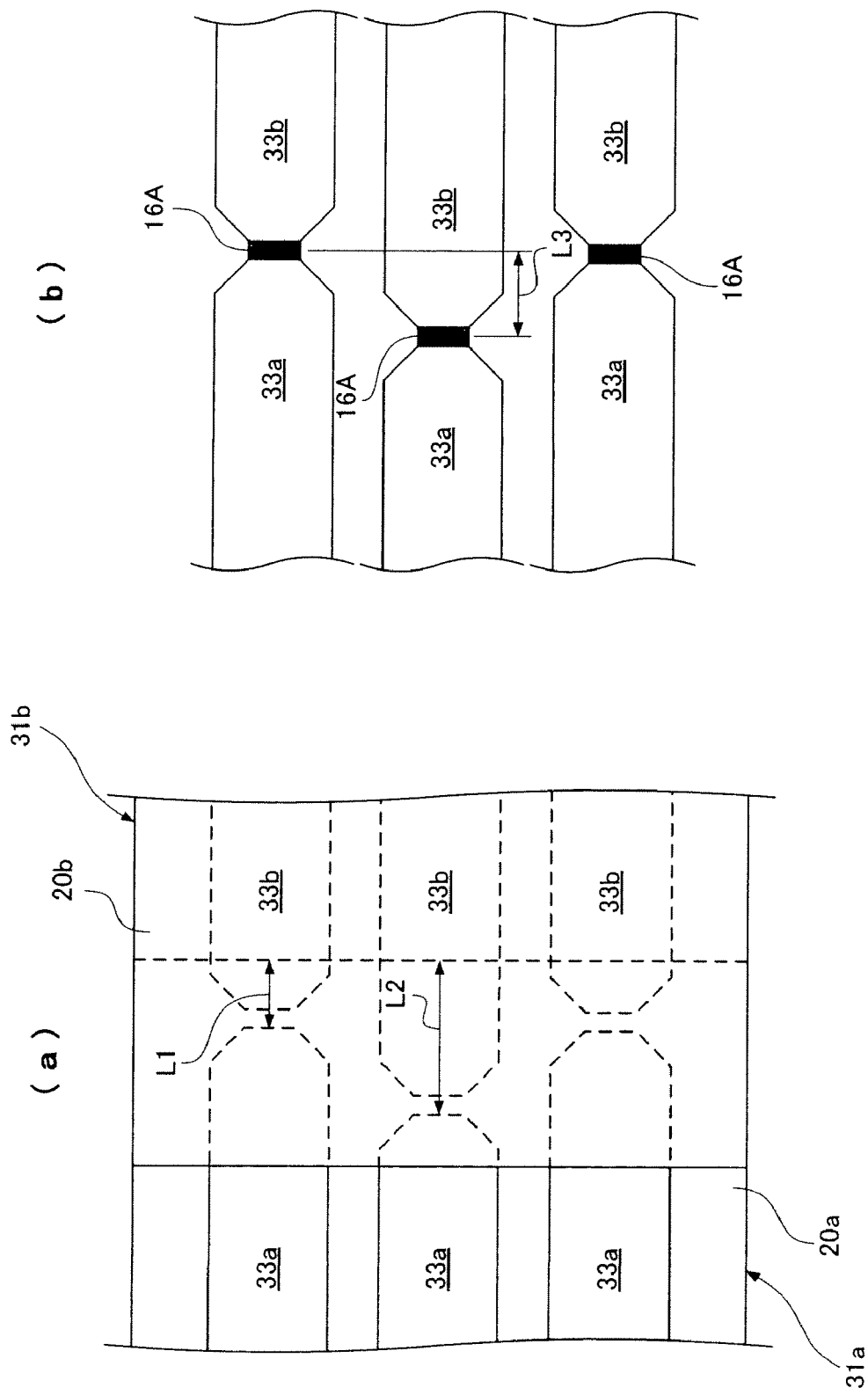
FIGS. 19A and 19B are plan diagrams showing examples of the layout of connecting terminals according to a further embodiment, being explanatory diagrams of the state of connection.

FIG. 19A shows a state of overlapping of a board 31a and a board 31b, and although not shown in the drawings, similarly to FIG. 3A, a fluid 14 is sandwiched between the connecting terminal 34a of the board 31a and the connecting terminal 34b of the board 31b. In this specific example, the wires 33a of the board 31a are of two types, one which is withdrawn by a distance of L1 from the end of the board 31a and the other which is withdrawn by a distance of L2 from the end of the board 31a, and the wires 33a having a distance of L1 and wires 33a having a distance of L2 are formed in an alternating fashion. Similarly, on the board 31b as well, wires 33b having a distance L1 from the end of the board 31b and wires 33b having a distance L2 from the end of the board 31b are formed in an alternating fashion.

In this way, as shown in FIG. 19B, the positions of the joints created by the solder 16A between the wires 33a and 33b are shifted respectively by a distance of L3 in the horizontal direction, between adjacent wires by heating the fluid 14 and then cooling. Here, the case of the shape in FIG. 18A was described as an example, but the same applies to the case of any of the shapes in FIGS. 18B to 18E, and particularly beneficial effects are obtained in narrowing the pitch between the wires.

In the respective embodiments described above, the boards 31a and 31b had wires 33a or 33b formed on one surface only, but similar beneficial effects are obtained if separate wires are formed on the opposite surface to the side where the wires 33a or wires 33b are formed. More specifically, the present invention is also valid in a case where the surface opposite to the side where the wires 33a or wires 33b are formed bears a ground pattern.

The present invention contributes to improving the reliability of jointing of a flexible board and a rigid board, or jointing of respective flexible boards, or electronic equipment of various types which requires jointing of respective flexible boards.

What is claimed is:

1. A circuit board in which a joint region in an end portion of a first board and a joint region in an end portion of a second board are mutually superimposed and connected with wires on respective surfaces of the boards facing each other,
wherein end faces of the wires in the first board are located at positions in the joint region of the first board but said wires do not extend to the end of said first board,
end faces of the wires in the second board are located at positions in the joint region of the second board but said wires do not extend to the end of said second board,
a gap between the end faces of the wires of the first board and the end faces of the wires of the second board is filled with a conductor, so that the end faces of the wires of the first board and the end faces of the wires of the second board are directly connected by the conductor, and
the first board and the second board are connected by a resin.

2. The circuit board according to claim 1, wherein the end portions of the wires of the first and second boards have a planar shape which is either an oblique shape, a key shape, a concavoconvex shape, a step shape or a funnel shape.

3. The circuit board according to claim 1, wherein a distance between the end faces of the wires of the first board and the end faces of the wires of the second board is smaller than an interval between the wires on the first board and an interval between the wires on the second board.

4. The circuit board according to claim 1, wherein end faces of connecting terminals are abutted against each other in such a manner that centers of the connecting terminals coincide with each other.

5. The circuit board according to claim 1, wherein the end faces of the wires of the first board and the end faces of the wires of the second board are adjacent each other in such a manner that a uniform gap is maintained between the end faces.

6. The circuit board according to claim 1, wherein the wires are in parallel, respectively, on the first board and on the second board, and mutually adjacent first and second wires are spaced from the end of a board by different distances.

* * * * *